(12) United States Patent
Sugimoto et al.

(10) Patent No.: US 11,501,830 B2
(45) Date of Patent: Nov. 15, 2022

(54) SEMICONDUCTOR STORAGE DEVICE

(71) Applicant: Kioxia Corporation, Tokyo (JP)

(72) Inventors: Takeshi Sugimoto, Yokohama (JP); Atsushi Kawasumi, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/348,005

(22) Filed: Jun. 15, 2021

(65) Prior Publication Data
US 2022/0076743 A1 Mar. 10, 2022

(30) Foreign Application Priority Data

Sep. 10, 2020 (JP) .............................. JP2020-152244

(51) Int. Cl.
G11C 5/14 (2006.01)
G11C 13/00 (2006.01)

(52) U.S. Cl.
CPC ........ *G11C 13/004* (2013.01); *G11C 13/0026* (2013.01); *G11C 13/0038* (2013.01)

(58) Field of Classification Search
CPC .............. G11C 13/004; G11C 13/0026; G11C 13/0038
USPC .................................................... 365/189.09
See application file for complete search history.

(56) References Cited

U.S. PATENT DOCUMENTS 6,463,008 B2 * 10/2002 Okuda ................. G11C 29/028
365/233.5
8,649,754 B2 * 2/2014 Burgener ............... H01Q 23/00
455/341
2020/0020365 A1 1/2020 Takizawa

FOREIGN PATENT DOCUMENTS

JP 2020-009514 1/2020

* cited by examiner

*Primary Examiner* — Vu A Le
(74) *Attorney, Agent, or Firm* — Oblon, McClelland, Maier & Neustadt, L.L.P.

(57) ABSTRACT

According to the embodiment, in a first period, the semiconductor storage device maintains the switch in an ON state. In a second period, the semiconductor storage device performs a first operation, a second operation and a third operation while maintaining the switch in an OFF state. The second period is a period after the first period. The first operation is an operation to supply the first pulse having the first polarity from the first pulse generation circuit to the other end of the first capacitive element. The second operation is an operation to supply the second pulse having the second polarity from the second pulse generation circuit to the other end of the second capacitive element. The third operation is an operation to connect the first bit line to the first data line.

20 Claims, 20 Drawing Sheets

SEMICONDUCTOR STORAGE DEVICE

CROSS-REFERENCE TO RELATED APPLICATIONS

This application is based upon and claims the benefit of priority from Japanese Patent Application No. 2020-152244, filed on Sep. 10, 2020; the entire contents of which are incorporated herein by reference.

FIELD

Embodiments described herein relate generally to a semiconductor storage device.

BACKGROUND

In a semiconductor storage device including a memory cell, a bit line, a data line, and a sense amplifier, when the memory cell is connected to the sense amplifier via the bit line and the data line, a level of a signal output from the memory cell via the bit line and the data line is detected by the sense amplifier. At this time, it is desirable to appropriately detect the level of the signal of the memory cell.

DETAILED DESCRIPTION

Figure 1:
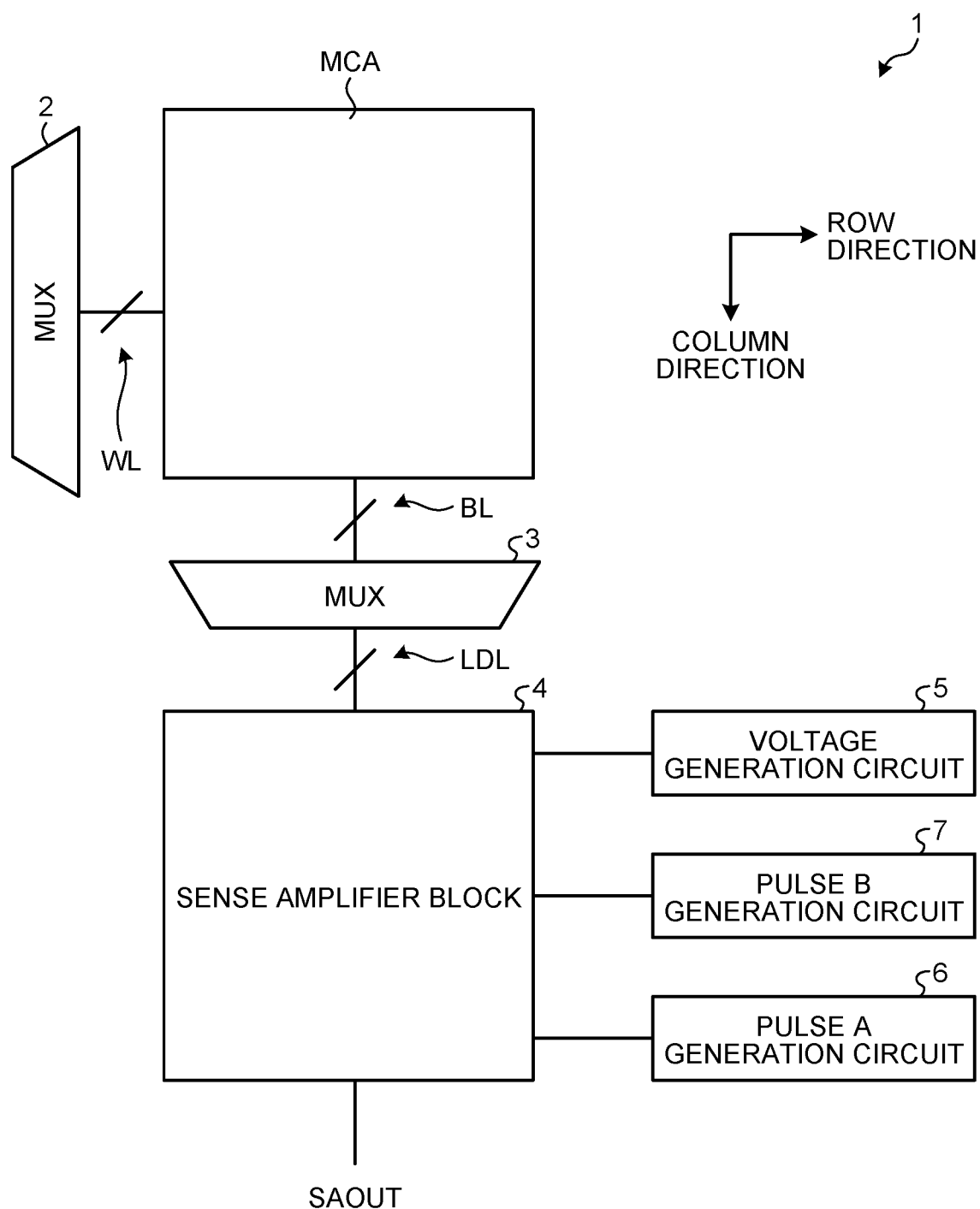
FIG. 1 is a diagram illustrating a configuration of a semiconductor storage device according to an embodiment.

In general, according to one embodiment, there is provided a semiconductor storage device including a first bit line, a first data line, a second bit line, a second data line, a sense amplifier, a switch, a voltage generation circuit, a first capacitive element, a second capacitive element, a first pulse generation circuit, and a second pulse generation circuit. The first bit line is connected to a first memory cell. The first data line is connectable to and disconnectable from the first bit line. The second bit line is connected to a second memory cell. The second data line is connectable to and disconnectable from the second bit line. The sense amplifier has a first input node connected to the first data line and a second input node connected to the second data line. The switch is capable of connecting the first data line and the second data line. The voltage generation circuit is capable of supplying a reference voltage to at least one of the first data line and the second data line. The first capacitive element has one end connected to the first data line. The second capacitive element has one end connected to the second data line. The first pulse generation circuit generates a first pulse having first polarity. The second pulse generation circuit generates a second pulse having second polarity. In a first period, the semiconductor storage device maintains the switch in an ON state. In a second period, the semiconductor storage device performs a first operation, a second operation and a third operation while maintaining the switch in an OFF state. The second period is a period after the first period. The first operation is an operation to supply the first pulse having the first polarity from the first pulse generation circuit to the other end of the first capacitive element. The second operation is an operation to supply the second pulse having the second polarity from the second pulse generation circuit to the other end of the second capacitive element. The third operation is an operation to connect the first bit line to the first data line.

Exemplary embodiments of a semiconductor storage device will be explained below in detail with reference to the accompanying drawings. The present invention is not limited to the following embodiments.

Embodiment

A semiconductor storage device according to an embodiment includes a memory cell, a bit line, a data line, and a sense amplifier. In the semiconductor storage device, when the memory cell is connected to the sense amplifier via the bit line and the data line, a signal level output from the memory cell via the bit line and the data line is detected by the sense amplifier.

The sense amplifier may be configured by a comparator in which one ends of two capacitive elements are connected to two input nodes. In this configuration, after one ends of the two capacitive elements are equipotential (equalized), the reference voltage is accumulated in one capacitive element, and the signal output from the memory cell via the bit line and the data line is accumulated in the other capacitive element. Then, by comparing the reference voltage accumulated in the one capacitive element with the signal level accumulated in the other capacitive element by the comparator, it is possible to detect which signal level of data values of 0 and 1 the signal level corresponds to.

At this time, when the signal level corresponding to the data value 0 is close to the level of the reference voltage, there is a possibility that the comparator makes an error in the magnitude determination of the reference voltage and the signal level and cannot appropriately detect the signal level.

On the other hand, when the capacitance value of the capacitive element in which the reference voltage is accumulated is increased in order to ensure a large signal amount, which is a level difference between the signal for the data value 0 and the reference voltage, the accumulation time of the signal in the capacitive element is long, and the sense amplifier operation tends to be delayed. It is desirable to secure the signal amount while speeding up the sense amplifier operation.

Therefore, in the present embodiment, in the sense amplifier operation, the semiconductor storage device supplies a positive potential pulse to the other end of the capacitive element in which the reference voltage is accumulated and supplies a negative potential pulse to the other end of the capacitive element in which the signal is accumulated, thereby securing the signal amount while speeding up the sense amplifier operation.

Specifically, a semiconductor storage device 1 can be configured as illustrated in FIG. 1. FIG. 1 is a diagram illustrating a configuration of the semiconductor storage device 1. The semiconductor storage device 1 includes a memory cell array MCA, a plurality of word lines WL0 to WL15, a plurality of bit lines BL0 to BL15, a row control unit 2, a column control unit 3, a sense amplifier block 4, a voltage generation circuit 5, and a pulse A generation circuit 6.

Figure 2:
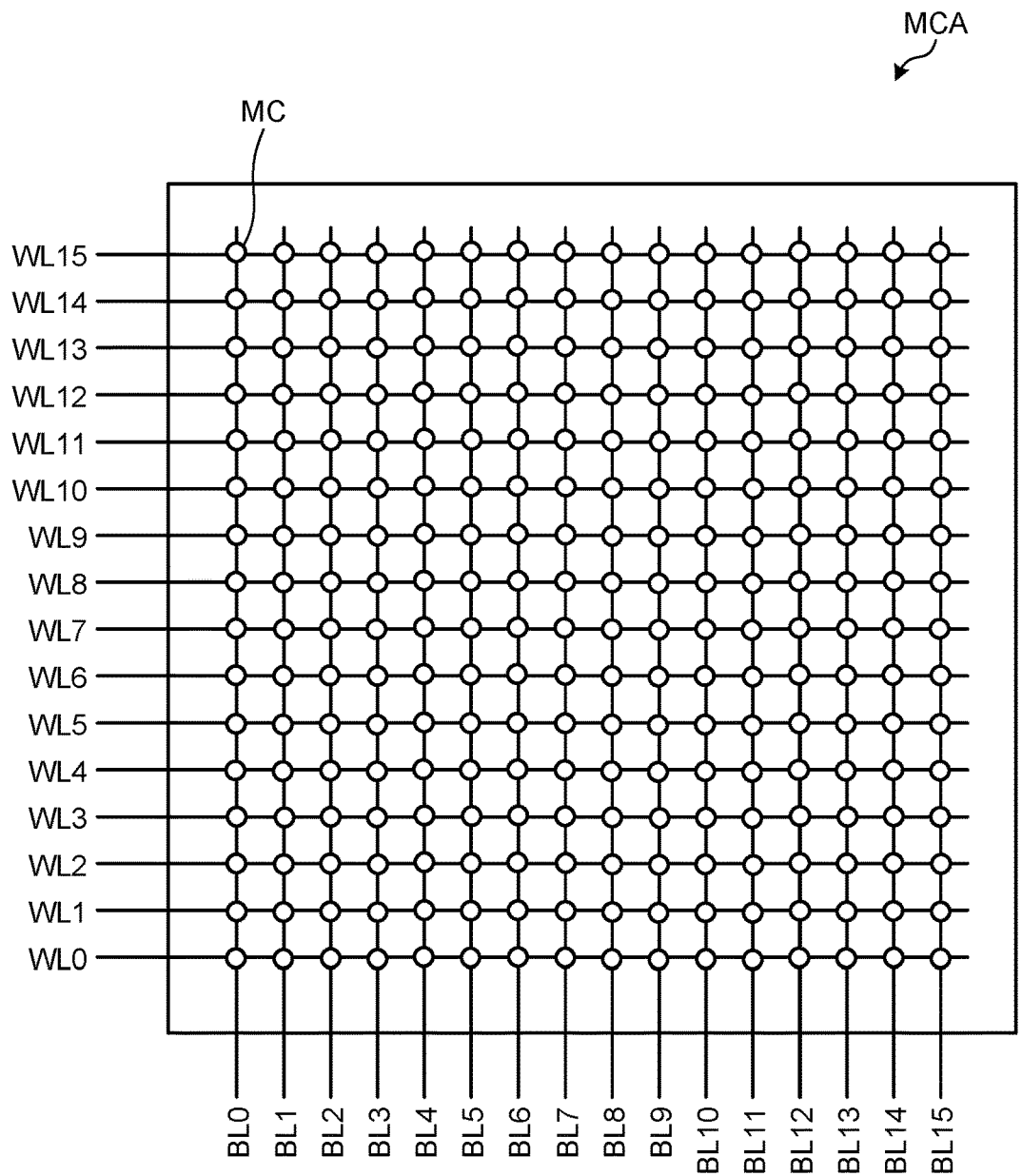
FIG. 2 is a diagram illustrating a configuration of a memory cell array according to the embodiment.

In the memory cell array MCA, as illustrated in FIG. 2, a plurality of memory cells MC is disposed in a matrix at positions where a plurality of word lines WL and a plurality of bit lines BL intersect. FIG. 2 is a diagram illustrating a configuration of the memory cell array MCA. FIG. 2 illustrates a configuration in which 16×16 memory cells MC are disposed at positions where 16 word lines WL0 to WL15 intersect with 16 bit lines BL0 to BL15. Each word line WL extends in the direction along the row (row direction), and each bit line BL extends in the direction along the column (column direction).

The row control unit 2 illustrated in FIG. 1 is disposed toward one end of the memory cell array MCA in the row direction, and is connected to the plurality of word lines WL. The row control unit 2 receives an address signal from the semiconductor storage device 1, selects a word line WL from the plurality of word lines WL according to the address signal, supplies a selected voltage (for example, the power supply voltage) to the selected word line WL, and supplies an unselected voltage (for example, the ground voltage) to the unselected word line WL. The row control unit 2 can be configured as a multiplexer (MUX). The row control unit 2 includes a first node to which the selected voltage is supplied and a second node to which the unselected voltage is supplied. In the default state, the plurality of word lines WL is connected to the second node and the word line WL corresponding to the address value decoded from the address signal is selectively connected to the first node.

The column control unit 3 is disposed toward one end of the memory cell array MCA in the column direction, and is connected to the plurality of bit lines BL. The column control unit 3 is connected between the plurality of bit lines BL and a plurality of local data lines LDL. The column control unit 3 receives the address signal from the semiconductor storage device 1, selects a bit line BL from the plurality of bit lines BL according to the address signal, and connects the selected bit line BL to the local data line LDL, and the signal from the selected memory cell MC is read out to the local data line LDL via the selected bit line BL. The column control unit 3 can be configured as a multiplexer (MUX).

The column control unit 3 groups the plurality of bit lines BL into a plurality of groups in units of the number of local data lines LDL, and can connect the plurality of bit lines BL to the plurality of local data lines LDL in unit of group. The column control unit 3 may select a group including the selected bit line BL corresponding to the address value decoded from the address signal and connect the selected group to the plurality of local data lines LDL.

The sense amplifier block 4 includes a comparator and two capacitive elements. The comparator and the two capacitive elements are connected via two data lines. As an initial setting, the sense amplifier block 4 short-circuits the two data lines to equalize them. Thereafter, the sense amplifier block 4 accumulates a reference signal Vref in one capacitive element of the two capacitive elements via one data line of the two data lines.

The sense amplifier block 4 is connected to the column control unit 3 via the plurality of local data lines LDL. The sense amplifier block 4 receives an address signal from the semiconductor storage device 1 and selects a local data line LDL from the plurality of local data lines LDL according to the address signal. As a result, in the sense amplifier block 4, the signal from the selected memory cell MC is read out to the other data line of the two data lines via the bit line BL and the local data line LDL. The sense amplifier block 4 accumulates a signal in the other capacitive element of the two capacitive elements via the other data line.

The one data line is at a level corresponding to the reference signal Vref, and the other data line is at a level corresponding to the signal. In this state, the sense amplifier block 4 compares the level of the one data line with the level of the other data line to perform a sense amplifier operation of detecting which signal level of data values of 0 and 1 the signal level corresponds to. The voltage generation circuit 5 is connected to the sense amplifier block 4. The voltage generation circuit 5 can supply the reference signal Vref to the sense amplifier block 4. For example, when performing the sense amplifier operation, the sense amplifier block 4 supplies the reference signal Vref received from the voltage generation circuit 5 to the selected local data line LDL as the selected voltage. As a result, the sense amplifier block 4 can cause the signal from the selected memory cell MC to be read out to the data line via the local data line LDL.

The pulse A generation circuit 6 is connected to the sense amplifier block 4. The pulse A generation circuit 6 can supply a pulse A to the sense amplifier block 4 when the sense amplifier block 4 performs a sense amplifier operation. In the sense amplifier operation, the pulse A generation circuit 6 supplies the positive potential pulse A to the other end of the capacitive element in which the reference voltage is accumulated.

A pulse B generation circuit 7 is connected to the sense amplifier block 4. The pulse B generation circuit 7 can supply a pulse B to the sense amplifier block 4 when the sense amplifier block 4 performs a sense amplifier operation. In the sense amplifier operation, the pulse B generation circuit 7 supplies the negative potential pulse B to the other end of the capacitive element in which the signal is accumulated.

Figure 3A:
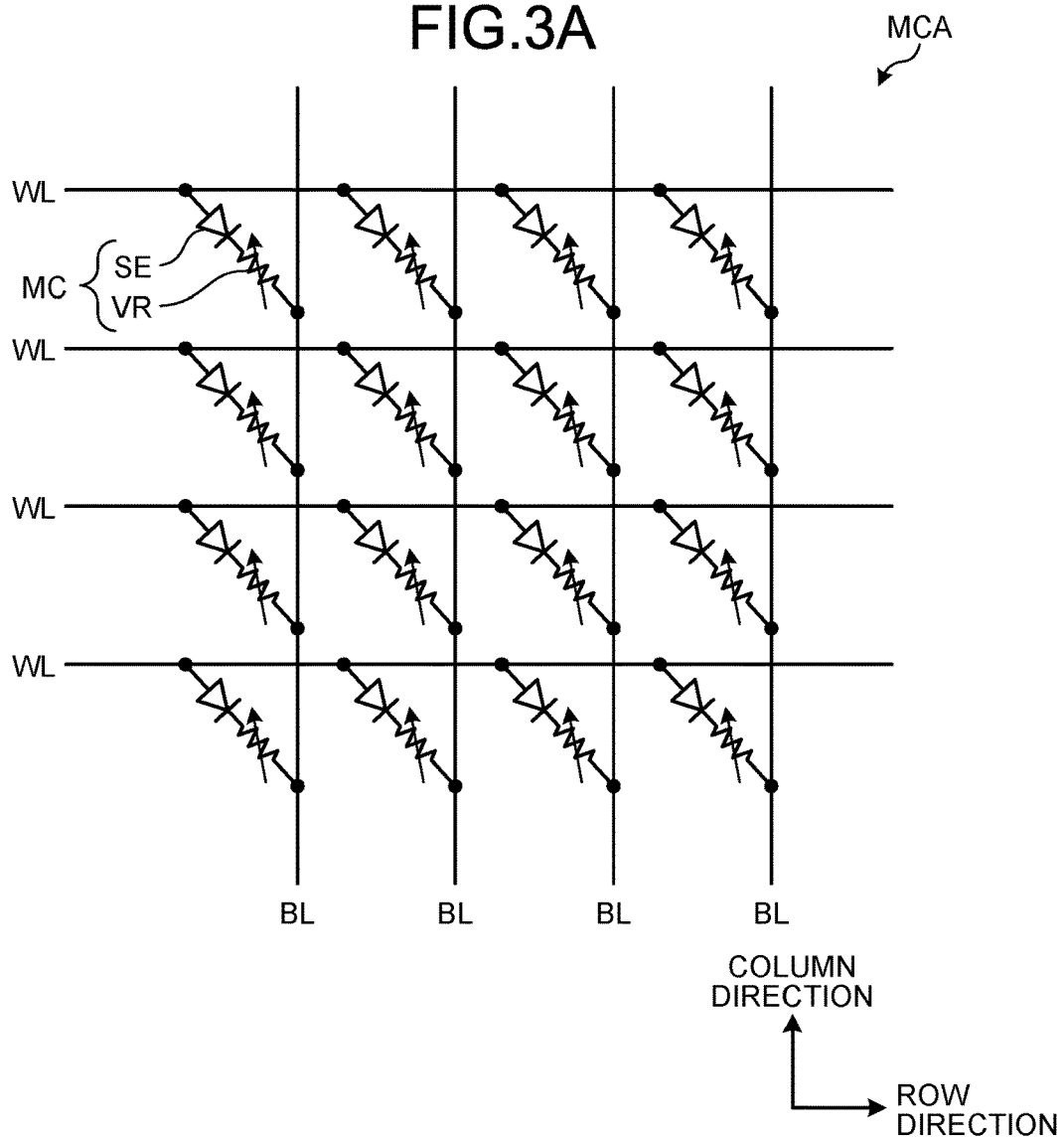
FIGS. 3A and 3B are diagrams illustrating a configuration of each memory cell in the embodiment.
Figure 3B:
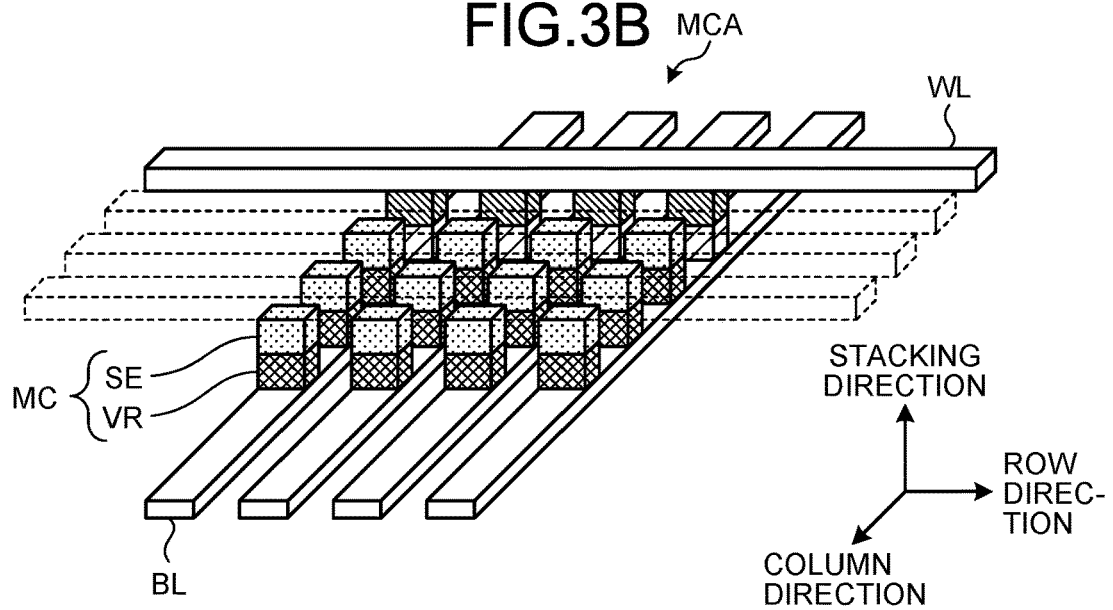

Each memory cell MC can be configured as illustrated in FIGS. 3A and 3B. FIGS. 3A and 3B are diagrams illustrating a configuration of the memory cell MC. FIG. 3A is a circuit diagram illustrating a circuit configuration of each memory cell MC, and FIG. 3B is a perspective view illustrating a layer configuration of each memory cell MC.

Each memory cell MC in the memory cell array MCA is disposed at a position where the word line WL extending in the row direction and the bit line BL extending in the column direction intersect. The memory cell MC has one end connected to the word line WL and the other end connected to the bit line BL.

As illustrated in FIG. 3A, each memory cell MC includes a variable resistance element VR and a switch element SE. The variable resistance element VR can be in a low resistance state and a high resistance state. The variable resistance element VR holds one-bit data using a difference in resistance state between the low resistance state and the high resistance state. For example, the switch element SE is in a high resistance state (non-conducting state, OFF state) when the applied voltage is less than the threshold value, and is in a non-conducting state (conducting state, ON state) when the applied voltage is equal to or greater than the threshold value. As a result, the switch element SE functions as a rectifying element having a rectifying function.

Although FIG. 3A illustrates the configuration in which the direction from the word line WL to the bit line BL is the rectification direction of the switch element SE, the direction from the bit line BL to the word line WL may be the rectification direction of the switch element SE. Alternatively, the switch element SE may be a bidirectional rectifying element.

In addition, although FIG. 3A illustrates a configuration in which the switch element SE is disposed toward the word line WL and the variable resistance element VR is disposed toward the bit line BL in the memory cell MC, the switch element SE may be disposed toward the bit line BL and the variable resistance element VR may be disposed toward the word line WL in the memory cell MC.

In the layer configuration, as illustrated in FIG. 3B, the word line WL extending in the row direction is away from the bit line BL extending in the column direction in the stacking direction. Each memory cell MC is disposed between the bit line BL and the word line WL at a position where the bit line BL and the word line WL intersect. As a result, the cross-point memory cell array MCA in which the plurality of memory cells MC is disposed in a matrix in plan view is configured.

In each memory cell MC, for example, a layer of the variable resistance element VR and a layer of the switch element SE are disposed in the stacking direction. Although FIG. 3B illustrates the configuration in which the layer of the switch element SE is stacked on the layer of the variable resistance element VR, the configuration may be such that the layer of the variable resistance element VR is stacked on the layer of the switch element SE.

Note that FIG. 3B illustrates an example in which each of the bit line BL and the word line WL is one layer, and one layer of the memory cell MC is disposed therebetween, but the present invention is not limited thereto. The number of layers in which the memory cells MC are disposed may be further increased, and correspondingly, the number of layers of the bit line BL and/or the word line WL may be further increased. That is, in the memory cell array MCA, a three-dimensional array of the memory cells MC may be realized by stacking a two-dimensional array (memory layer) of the memory cells MC.

For example, the plurality of bit lines BL extending in a direction orthogonal to the direction in which the word lines WL extend may be further provided at intervals on the plurality of word lines WL in FIG. 3B, and the plurality of memory cells MC may be further disposed at intersections of the plurality of word lines WL and the plurality of upper bit lines BL. In this case, the memory cell MC has two layers, and the wiring layer (the layer of the bit line BL and the layer of the word line WL) has three layers.

Figure 4:
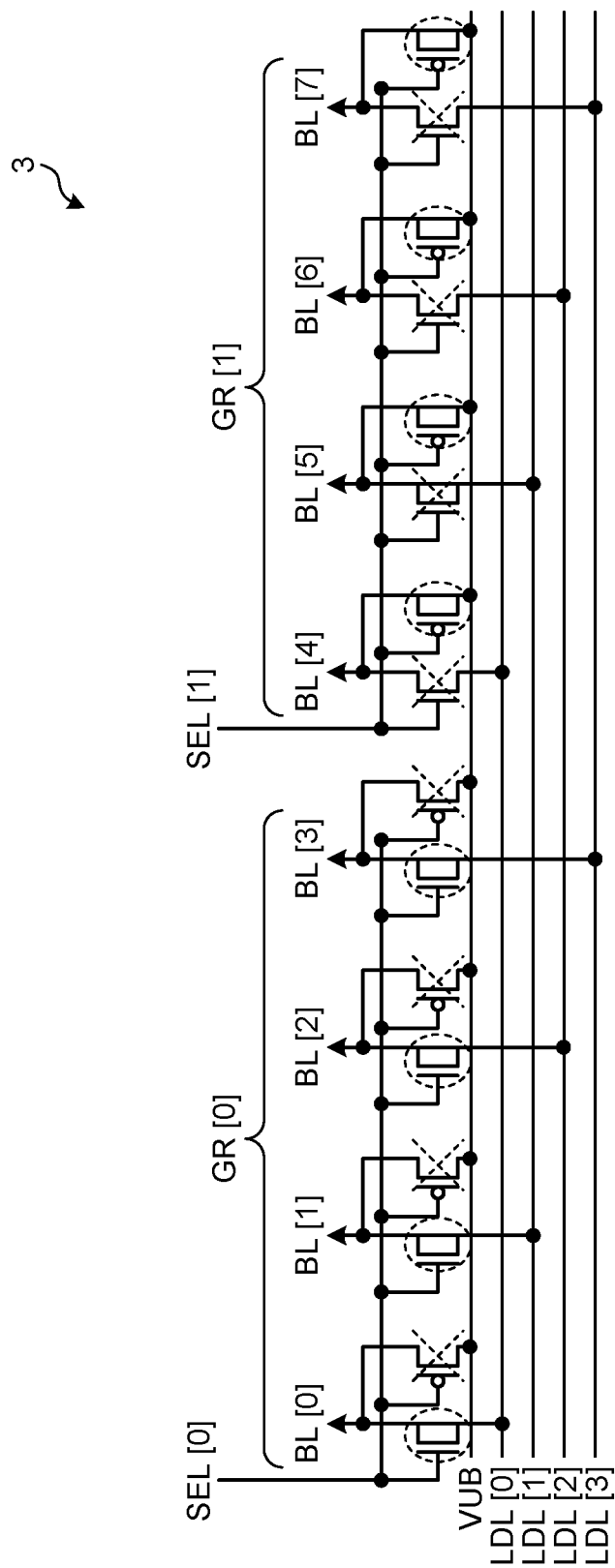
FIG. 4 is a diagram illustrating a configuration of a column control unit according to the embodiment.

The column control unit 3 is configured as illustrated in FIG. 4. FIG. 4 is a diagram illustrating a configuration of the column control unit 3. FIG. 4 illustrates a configuration in which eight bit lines BL[0] to BL[7] are connected to the column control unit 3, and four local data lines LDL[0] to LDL[3] are connected to the column control unit 3. The eight bit lines BL[0] to BL[7] are grouped into two groups GR[0] to GR[1] in unit of four. In the column control unit 3, four NMOS transistors for the group GR[0] are electrically connected between the bit lines BL[0] to BL[3] and the local data lines LDL[0] to LDL[3], and four PMOS transistors for the group GR[0] are electrically connected between the bit lines BL[0] to BL[3] and the reference voltage VUB. The selection signal SEL[0] is supplied to the gate of each transistor for the group GR[0]. In the column control unit 3, four NMOS transistors for the group GR[1] are electrically connected between the bit lines BL[4] to BL[7] and the local data lines LDL[0] to LDL[3], and four PMOS transistors for the group GR[1] are electrically connected between the bit lines BL[4] to BL[7] and the unselected voltage VUB. The selection signal SEL[0] is supplied to the gate of each transistor for the group GR[1].

For example, when the bit line BL corresponding to the address value decoded from the address signal is the bit line BL[0], the column control unit 3 generates the selection signal SEL[0:1]=(1, 0) to supply the generated selection signal SEL[0:1]=(1, 0) to the gate of each transistor. As a result, as illustrated in FIG. 4, the group GR[0] is selected, the four NMOS transistors for the group GR[0] are turned on, the four PMOS transistors are turned off, and the bit lines BL[0] to BL[3] are connected to the local data lines LDL[0] to LDL[3]. The column control unit 3 applies a selected voltage to the local data line LDL[0], and applies an unselected voltage to the local data lines LDL[1] to LDL[3]. As a result, the signal from the selected memory cell MC is read out to the local data line LDL[0] via the selected bit line BL[0]. On the other hand, the four NMOS transistors for the group GR[1] are turned off, and the four PMOS transistors are turned on. As a result, the group GR[1] is unselected, and the unselected voltage VUB is supplied to the bit lines BL[4] to BL[7].

Figure 5:
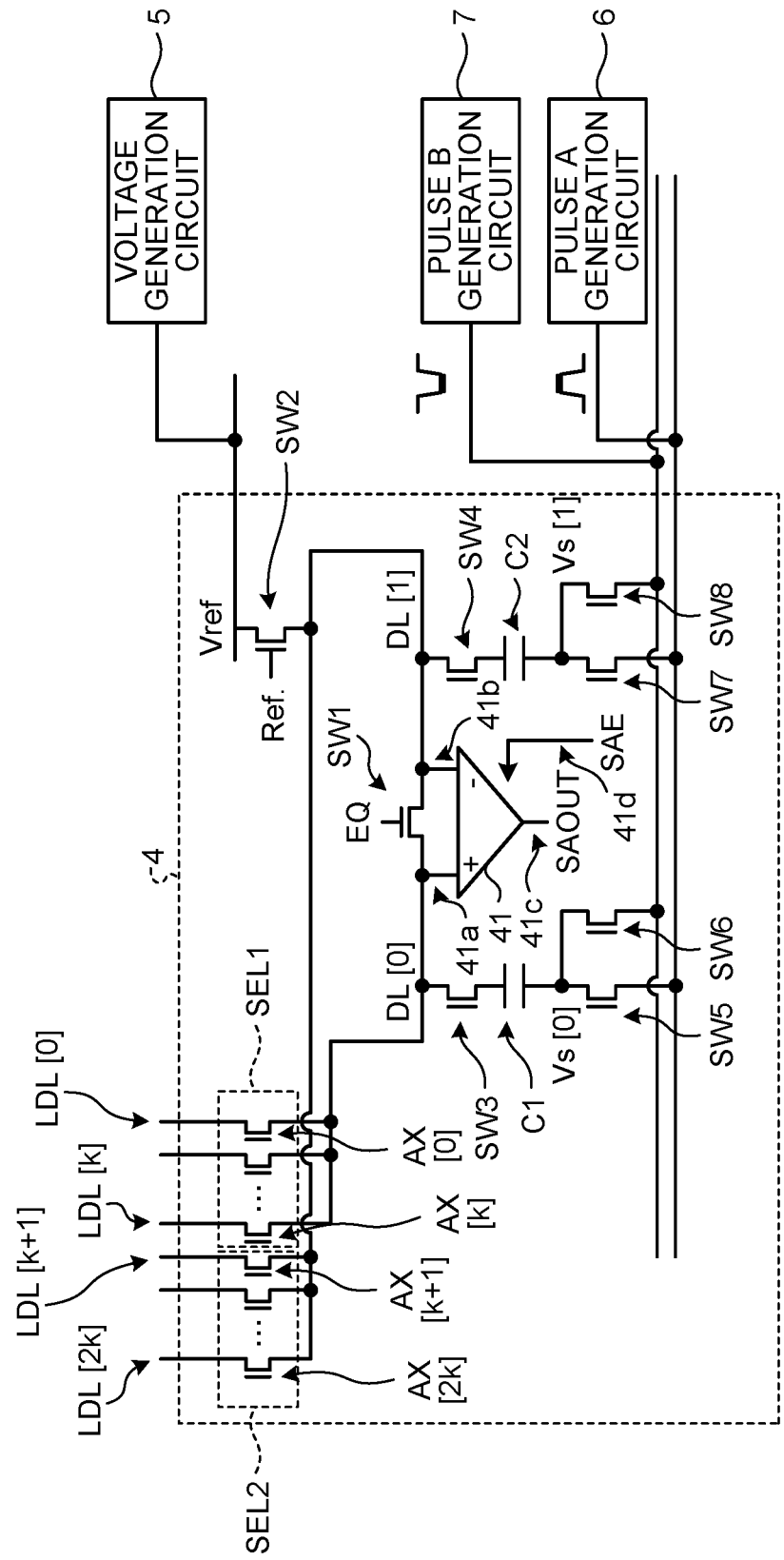
FIG. 5 is a diagram illustrating a configuration of a sense amplifier block according to the embodiment.

As illustrated in FIG. 5, the sense amplifier block 4 includes a sense amplifier 41 and two capacitive elements C1 and C2. FIG. 5 is a diagram illustrating a configuration of the sense amplifier block 4. The sense amplifier block 4 includes the sense amplifier 41, selectors SEL1 and SEL2, data lines DL[0] and DL[1], the capacitive elements C1 and C2, and a plurality of switches SW1 to SW8.

The sense amplifier 41 is configured by, for example, a comparator, and includes an input node 41a corresponding to a non-inverting input terminal, an input node 41b corresponding to an inverting input terminal, an output node 41c, and a control node 41d that receives a sense amplifier enable signal SAE. When receiving the sense amplifier enable signal SAE at the non-active level, the sense amplifier 41 stops the output thereof. When receiving the sense amplifier enable signal SAE at the active level, the sense amplifier 41 compares the level of the input node 41a with the level of the input node 41b, to output a comparison result SAOUT. The sense amplifier 41 outputs the H level SAOUT from the output node 41c when the level of the input node 41a is higher than the level of the input node 41b, and outputs the L level SAOUT from the output node 41c when the level of the input node 41a is lower than the level of the input node 41b.

The selector SEL1 is electrically connected between the plurality of local data lines LDL[0] to LDL[k] and the data line DL[0]. The selector SEL1 includes a plurality of switches AX[0] to AX[k] corresponding to the plurality of local data lines LDL[0] to LDL[k]. Each switch AX is, for example, an NMOS transistor or a transfer gate, and connects the corresponding local data line LDL to the data line DL[0] when an active control signal AX is received at the control terminal (gate), and disconnects the corresponding local data line LDL from the data line DL[0] when a non-active control signal AX is received at the control terminal. When the control signals AX[0] to AX[k] include the active control signal AX (that is, in a case where a signal is read out to the data line DL[0]), the selector SEL1 selects one local data line LDL from the plurality of local data lines LDL[0] to LDL[k] according to the active control signal AX, and connects the selected local data line LDL to the data line DL[0].

The selector SEL2 is electrically connected between the plurality of local data lines LDL[k+1] to LDL[2k] and the data line DL[1]. The selector SEL2 includes a plurality of switches AX[k+1] to AX[2k] corresponding to the plurality of local data lines LDL[k+1] to LDL[2k]. Each switch AX is, for example, an NMOS transistor or a transfer gate, connects the corresponding local data line LDL to the data line DL[1] when an active control signal AX is received at the control terminal (gate), and disconnects the corresponding local data line LDL from the data line DL[1] when a non-active control signal AX is received at the control terminal. When the control signals AX[k+1] to AX[2k] include an active control signal AX (that is, in a case where a signal is read out to the data line DL[1]), the selector SEL2 selects one local data line LDL from the plurality of local data lines LDL[k+1] to LDL[2k] according to the active control signal AX, and connects the selected local data line LDL to the data line DL[1].

The data line DL[0] is electrically connected to the output node of the selector SEL1 and the input node 41a of the sense amplifier 41. The data line DL[0] is electrically connected to the data line DL[1] via the switch SW1, and is electrically connected to one end of the capacitive element C1 via the switch SW3.

The data line DL[1] is electrically connected to the output node of the selector SEL2, one end of the capacitive element C2, and the input node 41b of the sense amplifier 41. The data line DL[1] is electrically connected to the data line DL[0] via the switch SW1, and is electrically connected to one end of the capacitive element C2 via the switch SW4.

The data line DL[1] is electrically connected to the voltage generation circuit 5 via the switch Sw2.

One end of the capacitive element C1 is electrically connected to the data line DL[0] via the switch SW3. The other end of the capacitive element C1 is electrically connected to the pulse A generation circuit 6 and the pulse B generation circuit 7 via the switches SW5 and SW6, respectively.

One end of the capacitive element C2 is electrically connected to the data line DL[1] via the switch SW4. The other end of the capacitive element C2 is electrically connected to the pulse A generation circuit 6 and the pulse B generation circuit 7 via the switches SW7 and SW8, respectively.

The switch SW1 is electrically connected between the data line DL[0] and the data line DL[1]. The switch SW1 electrically connects the data line DL[0] and the data line DL[1] in response to the active level control signal EQ, and electrically disconnects the data line DL[0] and the data line DL[1] in response to the non-active level control signal EQ. The switch SW1 includes, for example, the NMOS transistor. The NMOS transistor receives the control signal EQ at the gate, and one of the source and the drain is connected to the data line DL[0] and the other is connected to the data line DL[1].

The switch SW2 is electrically connected between the data line DL[1] and the voltage generation circuit 5. The switch SW2 electrically connects the output node of the voltage generation circuit 5 to the data line DL[1] in response to the active level control signal Ref, and electrically disconnects the output node of the voltage generation circuit 5 from the data line DL[1] in response to the non-active level control signal Ref. The switch SW2 includes, for example, the NMOS transistor. The NMOS transistor receives the control signal Ref at the gate, has the source connected to the data line DL[1], and has the drain connected to an output node of the voltage generation circuit 5.

The switch SW3 is electrically connected between the data line DL[0] and the capacitive element C1. The switch SW3 electrically connects the data line DL[0] to one end of the capacitive element C1 in response to the active level control signal φSW3, and electrically disconnects the data line DL[0] from one end of the capacitive element C1 in response to the non-active level control signal φSW3. The switch SW3 includes, for example, the NMOS transistor. The NMOS transistor receives a control signal φSW3 at a gate, has the source connected to one end of the capacitive element C1, and has the drain connected to the data line DL[0].

The switch SW4 is electrically connected between the data line DL[1] and the capacitive element C2. The switch SW4 electrically connects the data line DL[1] to one end of the capacitive element C2 in response to the active level control signal φSW4, and electrically disconnects the data line DL[1] from one end of the capacitive element C2 in response to the non-active level control signal φSW4. The switch SW4 includes, for example, the NMOS transistor. The NMOS transistor receives the control signal φSW4 at the gate, has the source connected to one end of the capacitive element C2, and has the drain connected to the data line DL[1].

The switch SW5 is electrically connected between the capacitive element C1 and the pulse A generation circuit 6. The switch SW5 electrically connects the other end of the capacitive element C1 to the output node of the pulse A generation circuit 6 in response to the active level control signal φSW5, and electrically disconnects the other end of the capacitive element C1 from the output node of the pulse A generation circuit 6 in response to the non-active level control signal φSW5. The switch SW5 includes, for example, the NMOS transistor. The NMOS transistor receives the control signal φSW5 at the gate, has the source connected to the other end of the capacitive element C1, and has the drain connected to the output node of the pulse A generation circuit 6.

The switch SW6 is electrically connected between the capacitive element C1 and the pulse B generation circuit 7. The switch SW6 electrically connects the other end of the capacitive element C1 to the output node of the pulse B generation circuit 7 in response to the active level control signal φSW6, and electrically disconnects the other end of the capacitive element C1 from the output node of the pulse B generation circuit 7 in response to the non-active level control signal φSW6. The switch SW6 includes, for example, the NMOS transistor. The NMOS transistor receives the control signal φSW6 at the gate, has the source connected to the other end of the capacitive element C1, and has the drain connected to the output node of the pulse B generation circuit 7.

The switch SW7 is electrically connected between the capacitive element C2 and the pulse A generation circuit 6. The switch SW7 electrically connects the other end of the capacitive element C2 to the output node of the pulse A generation circuit 6 in response to the active level control signal φSW7, and electrically disconnects the other end of the capacitive element C2 from the output node of the pulse A generation circuit 6 in response to the non-active active level control signal φSW7. The switch SW7 includes, for example, the NMOS transistor. The NMOS transistor receives the control signal φSW7 at the gate, has the source connected to the other end of the capacitive element C2, and has the drain connected to the output node of the pulse A generation circuit 6.

The switch SW8 is electrically connected between the capacitive element C2 and the pulse B generation circuit 7. The switch SW8 electrically connects the other end of the capacitive element C2 to the output node of the pulse B generation circuit 7 in response to the active level control signal φSW8, and electrically disconnects the other end of the capacitive element C2 from the output node of the pulse B generation circuit 7 in response to the non-active level control signal φSW8. The switch SW8 includes, for example, the NMOS transistor. The NMOS transistor receives the control signal φSW8 at the gate, has the source connected to the other end of the capacitive element C2, and has the drain connected to the output node of the pulse B generation circuit 7.

Figure 6:
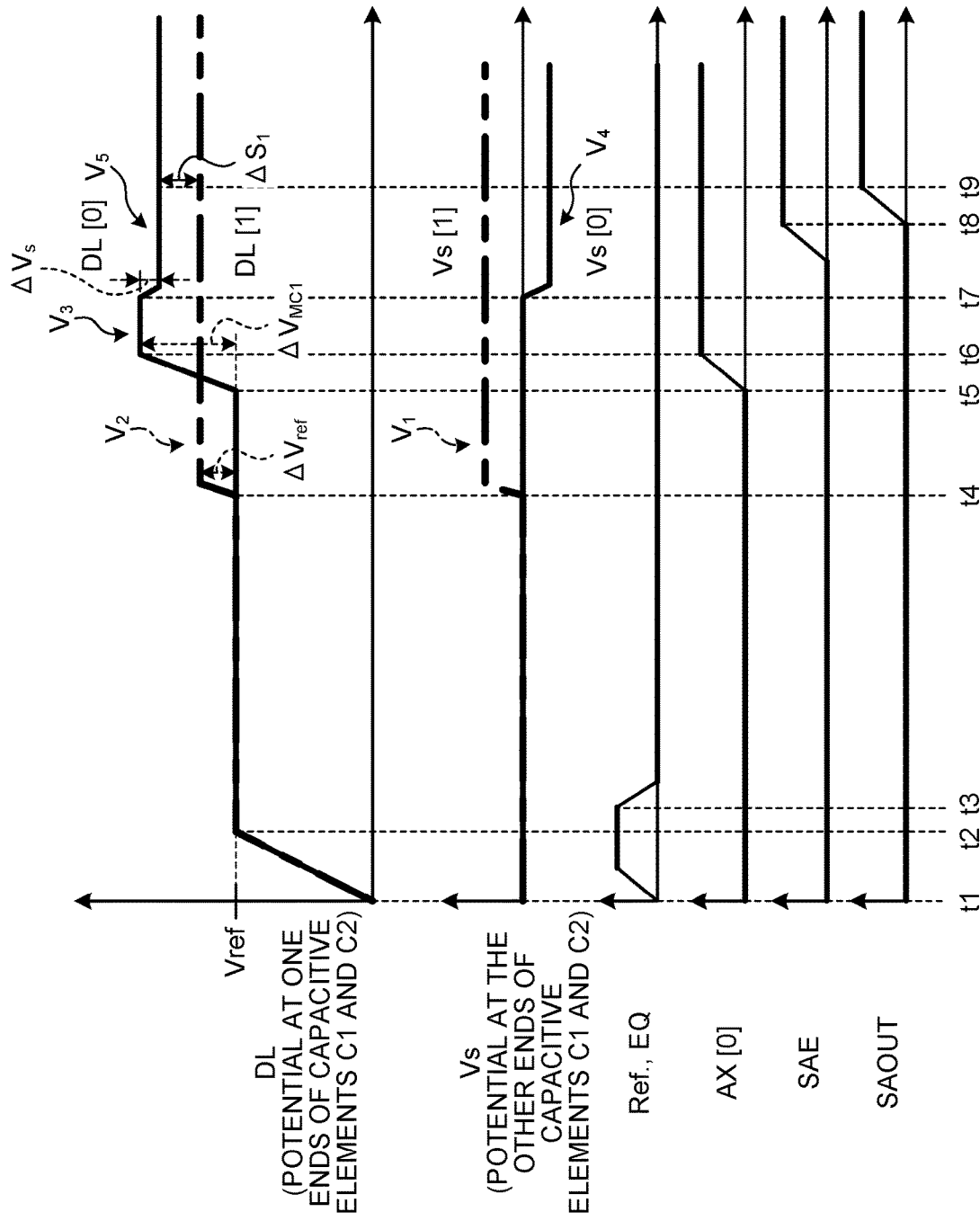
FIG. 6 is a diagram illustrating an operation of the sense amplifier block (when a signal is read out to the DL[0]) according to the embodiment.
Figure 7A:
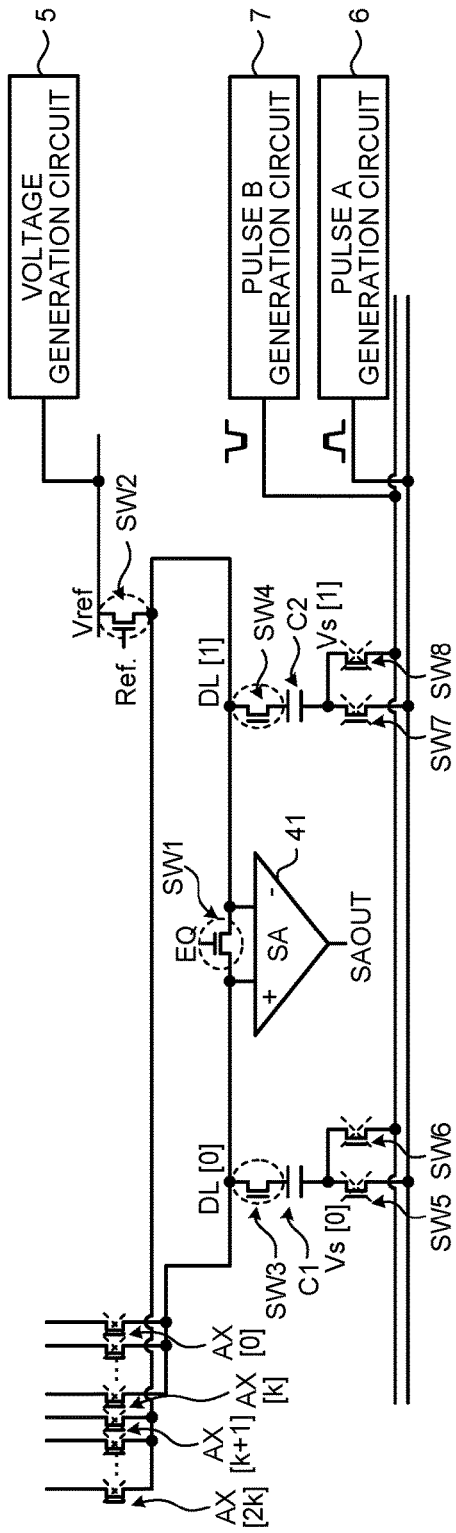
FIGS. 7A and 7B are diagrams illustrating an operation of the sense amplifier block (when a signal is read out to the DL[0]) according to the embodiment.
Figure 7B:
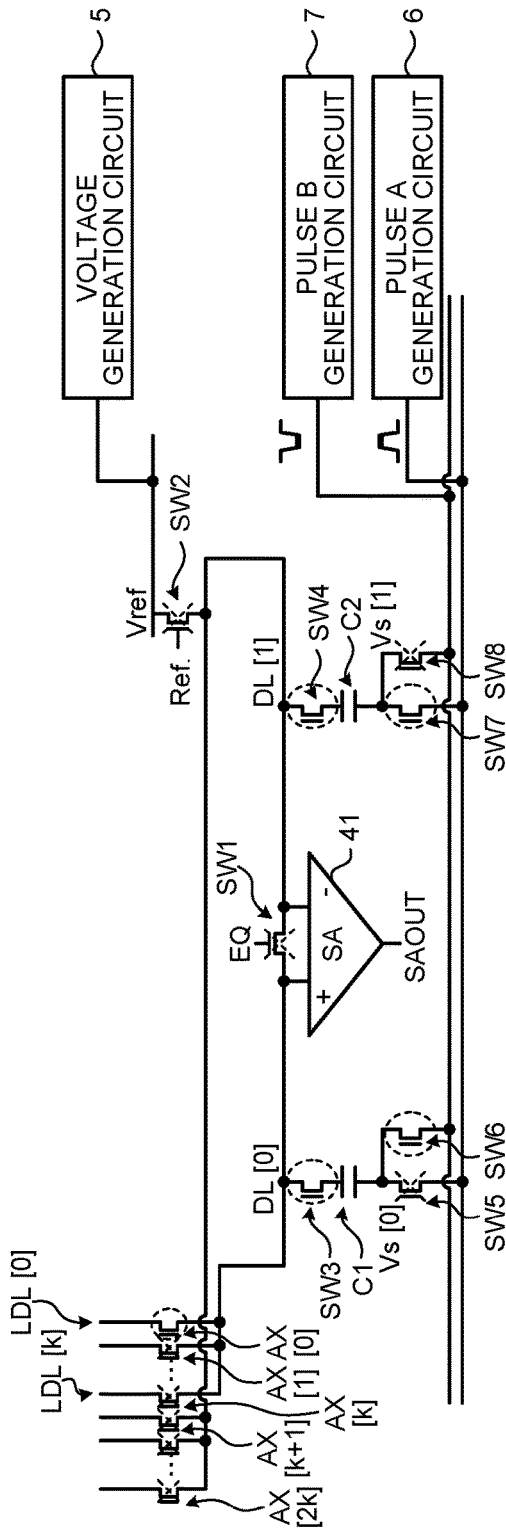
Figure 8:
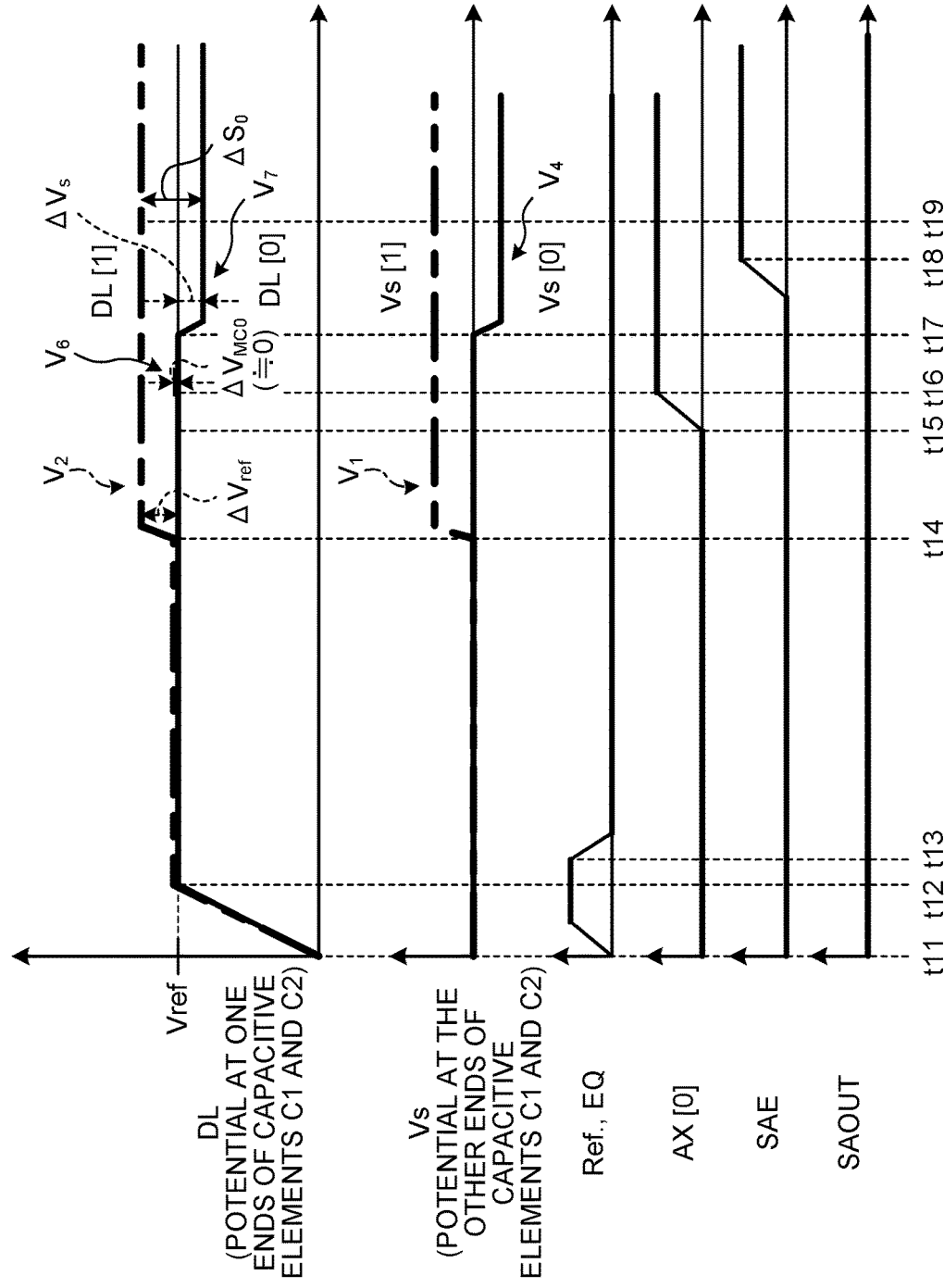
FIG. 8 is a waveform diagram illustrating an operation of the sense amplifier block (when a signal is read out to the DL[0]) according to the embodiment.

Next, the operation of the sense amplifier block 4 when a signal is read out to the data line DL[0] will be described with reference to FIGS. 6 to 8. FIGS. 6 and 8 are waveform diagrams illustrating the operation of the sense amplifier block (when a signal is read out to the DL[0]). FIGS. 7A and 7B are diagrams illustrating operation of each component in the sense amplifier block 4.

When a signal corresponding to the data value 1 is read out to the data line DL[0], a sense amplifier operation as illustrated in FIG. 6 is performed.

Immediately before timing t1, the sense amplifier block 4 maintains the switches AX[0] to AX[k] and AX[k+1] to AX[2k] of the selectors SEL1 and SEL2 in an OFF state as illustrated in FIG. 7A. In addition, the sense amplifier block 4 maintains the switches SW1 to SW8 in an OFF state. As a result, the potentials of the data lines DL[0] and DL[1], the one ends of the capacitive elements C1 and C2, and the other ends of the capacitive elements C1 and C2 are all at the reference level (for example, the ground level).

At timing t1, the sense amplifier block 4 turns on the switches SW1 to SW4 as illustrated in FIG. 7A. As a result, the data line DL[0], the data line DL[1], one end of the capacitive element C1, and one end of the capacitive element C2 are connected, the reference voltage Vref is supplied from the voltage generation circuit 5 to the data lines DL[0] and DL[1] and the one ends of the capacitive elements C1 and C2, and the potential thereof rises. That is, the electric charge is accumulated in the parasitic capacitance of the data line DL[0], the parasitic capacitance of the data line DL[1], one end of the capacitive element C1, and one end of the capacitive element C2 by the voltage generation circuit 5. As a result, the potential of the data line DL[0], the potential of the data line DL[1], the potential Vs[0] at one end of the capacitive element C1, and the potential Vs[1] at one end of the capacitive element C2 are equipotential to each other, and all are substantially equal to the level of the reference voltage Vref. Thus, the reference for comparison by the sense amplifier (comparator) 41 is equally set.

When the data lines DL[0] and DL[1] and the one ends of the capacitive elements C1 and C2 reach the level of the reference voltage Vref at timing t2, the sense amplifier block 4 turns off the switches SW1 and SW2 at timing t3 as illustrated in FIG. 7B. As a result, each of the data line DL[0], the data line DL[1], one end of the capacitive element C1, and one end of the capacitive element C2 is in a floating state while being held at the level of the reference voltage Vref.

At timing t4, as illustrated in FIG. 7B, the sense amplifier block 4 turns on the switch SW7 while maintaining the switch SW8 in an OFF state. As a result, the pulse A having the amplitude of the positive potential is supplied from the pulse A generation circuit 6 to the other end of the capacitive element C2, and the potential Vs[1] at the other end of the capacitive element C2 is shifted to the positive side by an amount corresponding to the amplitude $V_1$ of the pulse A as indicated by a dot-and-dash line in FIG. 6 to reach $V_1$ (>0).

As a result, the sense amplifier block 4 redistributes the electric charge accumulated in the data line DL[1] and one end of the capacitive element C2 according to the ratio between the parasitic capacitance value of the data line DL[1] and the capacitance value of the capacitive element C2. In response to this, the potential of the data line DL[1] is shifted in a direction in which the amplitude increases by a shift amount ΔVref corresponding to the shift amount of the potential Vs[1] as indicated by a dot-and-dash line in FIG. 6 to reach $V_2$ (>Vref). That is, the following Expression 1 is established.

$$\Delta Vref = V_2 - Vref = k_2 \times (V_1 - 0) \quad \text{Expression 1}$$

In Expression 1, the shift amount ΔVref is an absolute value of the shift amount and is a positive value. $k_2$ is a positive coefficient that changes depending on the capacitance value of the capacitive element C2 (for example, in proportion to the capacitance value of the capacitive element C2), and has a larger value as the capacitance value of the capacitive element C2 is larger.

At timing t5, as illustrated in FIG. 7B, the sense amplifier block 4 selectively turns on one switch AX[0] of the plurality of switches AX[0] to AX[k] in the selector SEL1. Accordingly, one selected local data line LDL[0] of the plurality of local data lines LDL[0] to LDL[k] is connected to the data line DL[0].

When the data value 1 is stored in the memory cell MC, a signal corresponding to the data value 1 is read out from the memory cell MC to the data line DL[0] via the selected bit line BL and the selected local data line LDL[0], and the potential of the data line DL[0] rises from the level of the reference voltage Vref.

At timing t6, the potential of the data line DL[0] reaches the level $V_3$ increased by the voltage $\Delta V_{MC1}$ corresponding to the data value 1 from the level of the reference voltage Vref. That is, the following Expression 2 is established.

$$V_3 = Vref + \Delta V_{MC1} \quad \text{Expression 2}$$

At timing t7, as illustrated in FIG. 7B, the sense amplifier block 4 turns on the switch SW6 while maintaining the switch SW5 in an OFF state. As a result, the pulse B having the amplitude of the negative potential is supplied from the pulse B generation circuit 7 to the other end of the capacitive element C1, and the potential Vs[0] at the other end of the capacitive element C1 is shifted to the negative side by an amount corresponding to the amplitude of the pulse B to reach $V_4$ (<0) as indicated by the solid line in FIG. 6.

As a result, the sense amplifier block 4 redistributes the electric charge accumulated in the data line DL[0] and one end of the capacitive element C1 according to the ratio between the parasitic capacitance value of the data line DL[0] and the capacitance value of the capacitive element C1. Accordingly, as indicated by a solid line in FIG. 6, the potential of the data line DL[0] is shifted in a direction in which the amplitude decreases by a shift amount $\Delta Vs$ proportional to the shift amount of the potential Vs[0] to reach $V_5$ (<$V_3$). That is, the following Expression 3 is established.

$$\Delta Vs = V_3 - V_5 = k_1 \times (0 - V_4) \quad \text{Expression 3}$$

In Expression 3, the shift amount $\Delta Vs$ is an absolute value of the shift amount and is a positive value. $k_1$ is a positive coefficient that changes depending on the capacitance value of the capacitive element C1, and has a larger value as the capacitance value of the capacitive element C1 is larger.

When the sense amplifier enable signal SAE is at the active level at timing t8, the sense amplifier 41 compares the level of the data line DL[0] with the level of the data line DL[1] at timing t9.

At this time, a signal amount $\Delta S_1$, which is a level difference between the signal for the data value 1 and the reference voltage, is expressed by the following Expression 4.

$$\Delta S_1 = V_5 - V_2 \quad \text{Expression 4}$$

According to Expressions 1 to 3, Expression 4 can be transformed into the following Expression 5.

$$\Delta S_1 = \Delta V_{MC1} - \Delta Vref - \Delta Vs \quad \text{Expression 5}$$

As illustrated in FIG. 6 and Expression 5, the signal amount $\Delta S_1$ for the data value 1 is reduced by the amount by which the shift amount $\Delta Vref$ of the data line DL[1] and the shift amount $\Delta Vs$ of the data line DL[0] are subtracted from the voltage $\Delta V_{MC1}$ corresponding to the data value 1, but is secured at a level sufficient for the comparison operation of the sense amplifier 41.

As a result, the sense amplifier 41 can detect that the level of the data line DL[0] is higher than the level of the data line DL[1], and can output the comparison result SAOUT of the H level. The comparison result SAOUT of the H level indicates that the data value 1 is detected by the sense amplifier 41.

On the other hand, in a case where a signal corresponding to the data value 0 is read out to the data line DL[0], a sense amplifier operation as illustrated in FIG. 8 is performed.

At timings t11 to t14, the sense amplifier block 4 performs the operation same as that at timings t1 to t4 illustrated in FIG. 6.

At timing t15, as illustrated in FIG. 7B, the sense amplifier block 4 selectively turns on one switch AX[0] of the plurality of switches AX[0] to AX[k] in the selector SEL1. Accordingly, one selected local data line LDL[0] of the plurality of local data lines LDL[0] to LDL[k] is connected to the data line DL[0].

When the data value 0 is stored in the memory cell MC, a signal corresponding to the data value 0 is read out from the memory cell MC to the data line [0] via the selected bit line BL and the selected local data line LDL.

At timing t16, the potential of the data line DL[0] reaches the level $V_6$ changed by the voltage $\Delta V_{MC0}$ ($\approx 0$) corresponding to the data value 0 with respect to the level of the reference voltage Vref. That is, the following Expression 6 is established.

$$V_6 = Vref + \Delta V_{MC0} \approx Vref \quad \text{Expression 6}$$

At timing t17, the sense amplifier block 4 turns on the switch SW6 while maintaining the switch SW5 in an OFF state as illustrated in FIG. 7B. As a result, the pulse B having the amplitude of the negative potential is supplied from the pulse B generation circuit 7 to the other end of the capacitive element C1, and the potential Vs[0] at the other end of the capacitive element C1 is shifted to the negative side by an amount corresponding to the amplitude of the pulse B to reach $V_4$ (<0) as indicated by the solid line in FIG. 8.

As a result, the sense amplifier block 4 redistributes the electric charge accumulated in the data line DL[0] and one end of the capacitive element C1 according to the ratio between the parasitic capacitance value of the data line DL[0] and the capacitance value of the capacitive element C1. Accordingly, as indicated by a solid line in FIG. 8, the potential of the data line DL[0] is shifted in a direction in which the amplitude decreases by a shift amount $\Delta Vs$ proportional to the shift amount of the potential Vs[0] to reach $V_5$ (<$V_3$). That is, the following Expression 7 is established.

$$\Delta Vs = V_6 - V_7 = k_1 \times (0 - V_4) \quad \text{Expression 7}$$

In Expression 7, the shift amount $\Delta Vs$ is an absolute value of the shift amount and is a positive value. $k_1$ is a positive coefficient that changes depending on the capacitance value of the capacitive element C1, and has a larger value as the capacitance value of the capacitive element C1 is larger.

When the sense amplifier enable signal SAE is at the active level at timing t18, the sense amplifier 41 compares the level of the data line DL[0] with the level of the data line DL[1] at timing t19.

At this time, a signal amount $\Delta S_0$, which is a level difference between the signal for the data value 0 and the reference voltage, is expressed by the following Expression 8.

$$\Delta S_0 = V_2 - V_7 \quad \text{Expression 8}$$

According to Expressions 1 to 3, 6, and 7, Expression 8 can be transformed into the following Expression 9.

$$\Delta S_0 = \Delta V_{MC0} + \Delta Vref + \Delta Vs \quad \text{Expression 9}$$

As illustrated in FIG. 8 and Expression 9, the signal amount $\Delta S_0$ for the data value 0 is increased by the addition of the shift amount $\Delta Vref$ of the data line DL[1] and the shift amount ΔVs of the data line DL[0] with respect to the voltage $\Delta V_{MC0}$ (≈0) corresponding to the data value 0, and is secured at a level sufficient for the comparison operation of the sense amplifier 41.

As a result, the sense amplifier 41 can detect that the level of the data line DL[0] is lower than the level of the data line DL[1], and can output the comparison result SAOUT of the L level. The comparison result SAOUT of the L level indicates that the data value 0 is detected by the sense amplifier 41.

Figure 9:
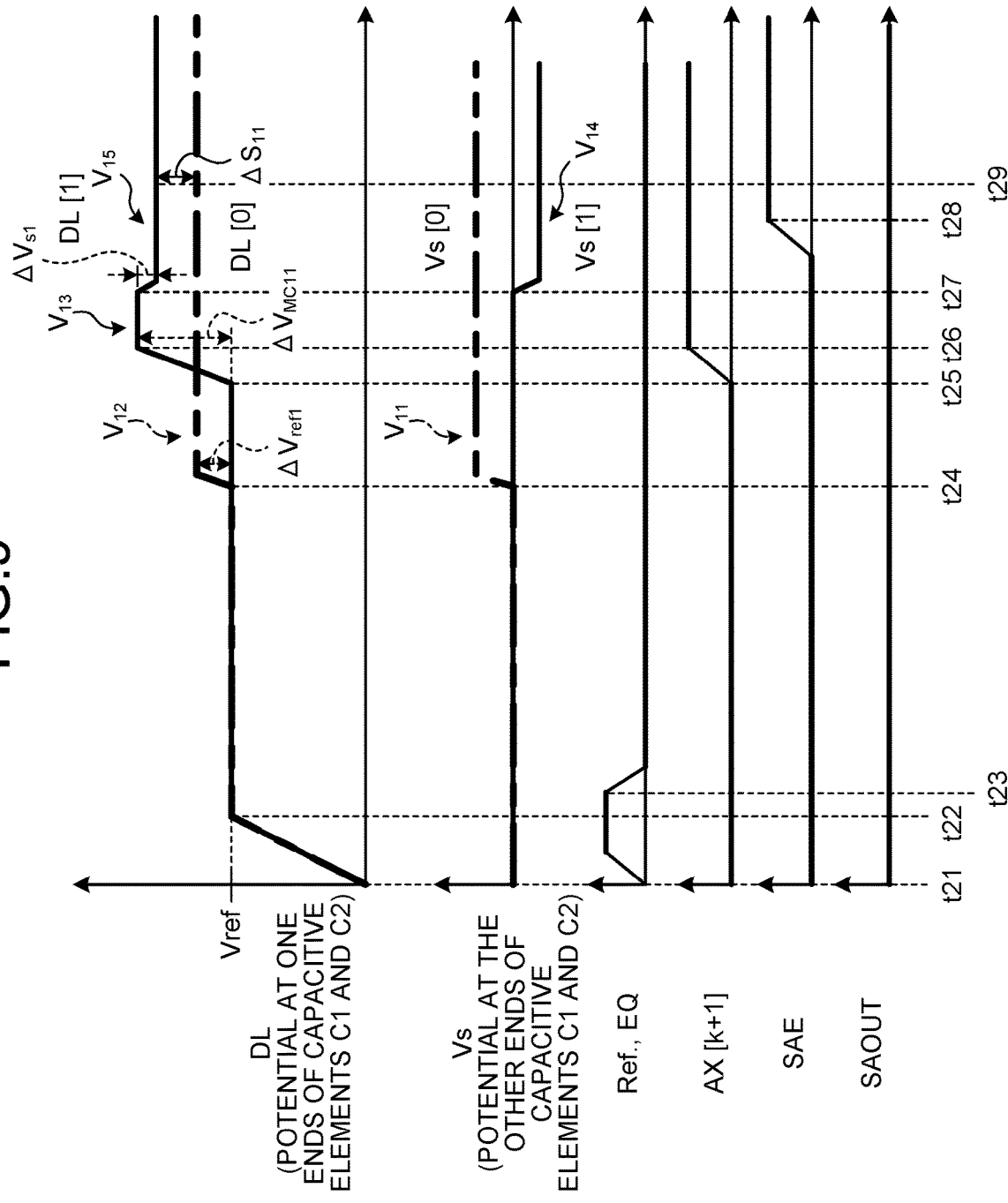
FIG. 9 is a diagram illustrating an operation of the sense amplifier block (when a signal is read out to the DL[1]) according to the embodiment.
Figure 10A:
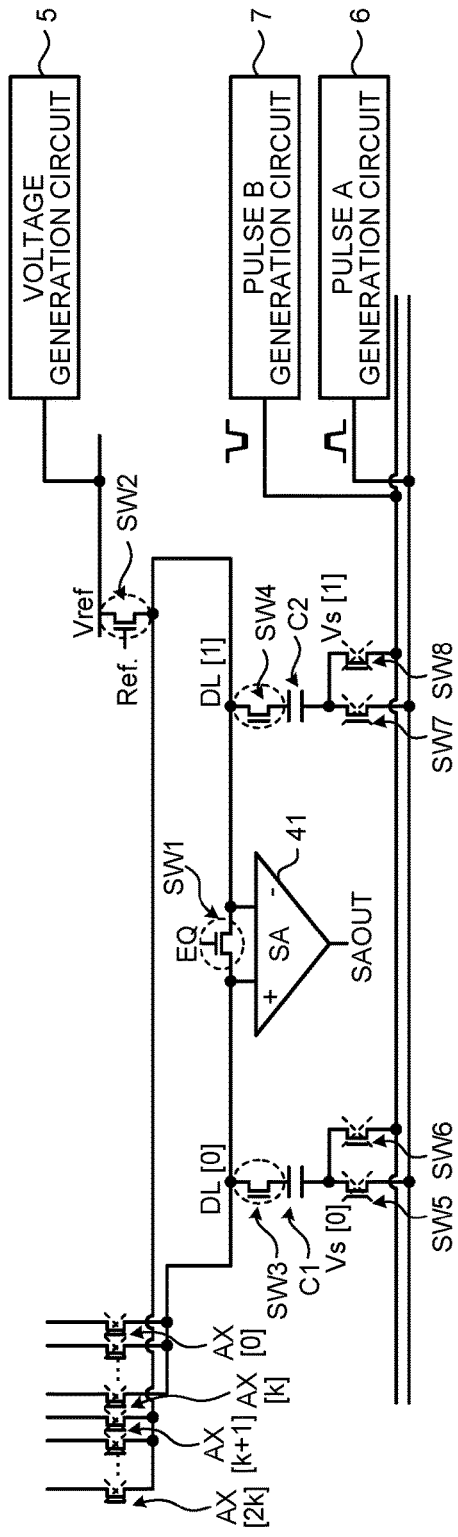
FIGS. 10A and 10B are diagrams illustrating an operation of the sense amplifier block (when a signal is read out to the DL[1]) according to the embodiment.
Figure 10B:
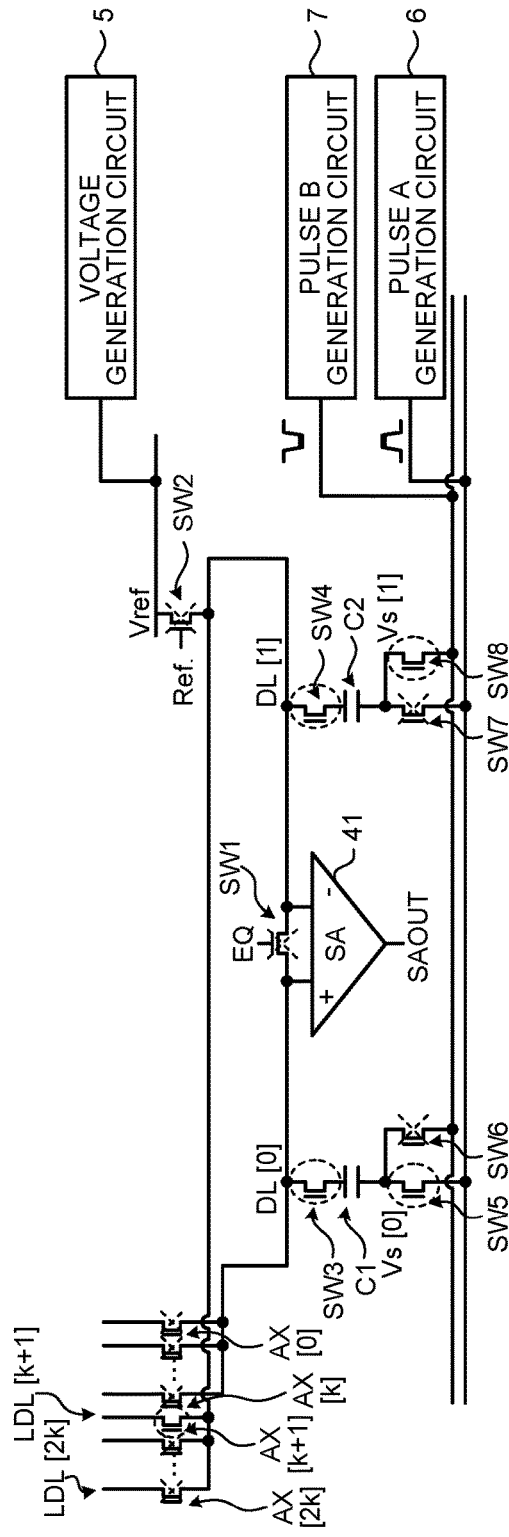
Figure 11:
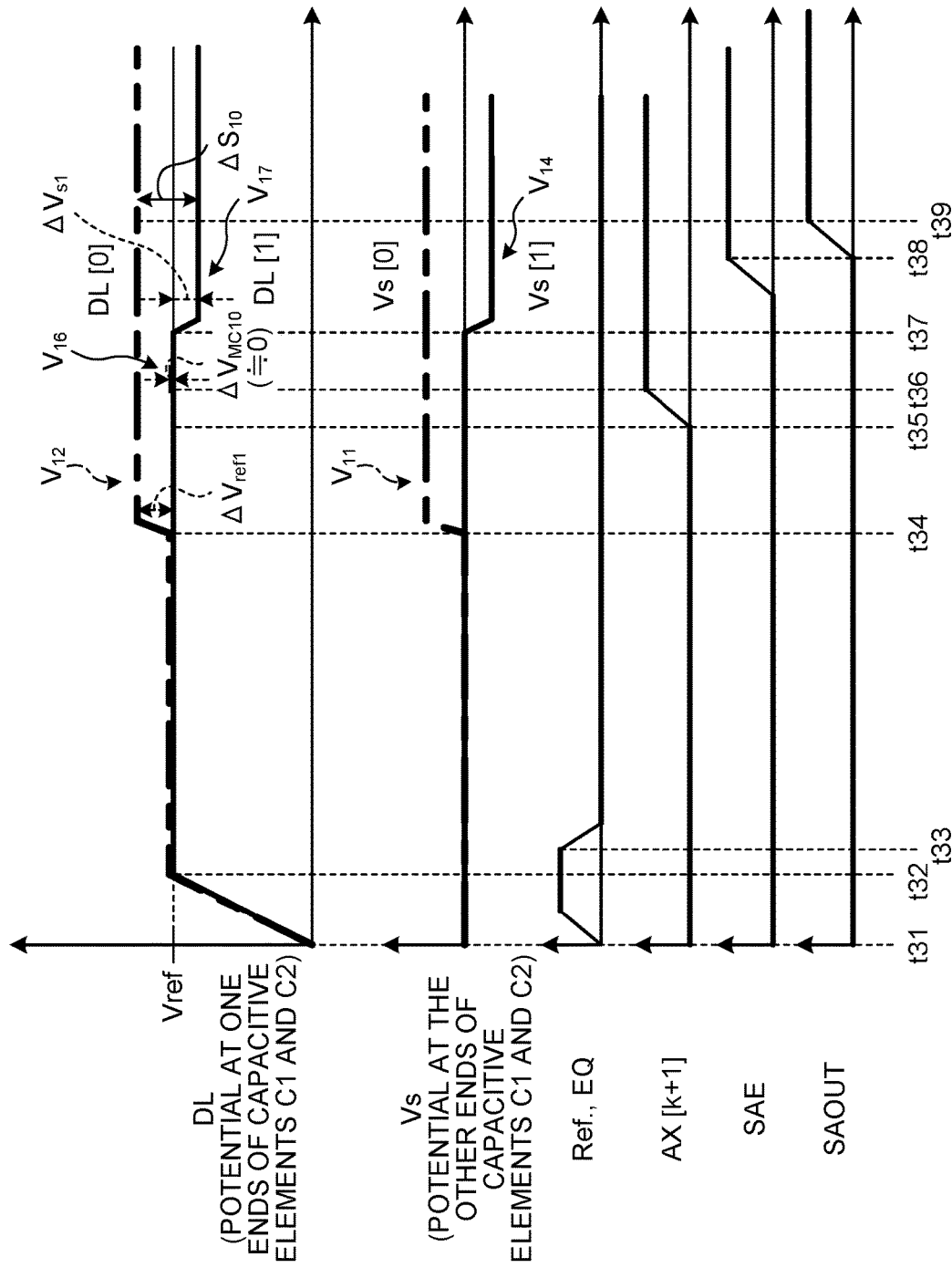
FIG. 11 is a waveform diagram illustrating an operation of the sense amplifier block (when a signal is read out to the DL[1]) according to the embodiment.

Next, the operation of the sense amplifier block 4 when a signal is read out to the data line DL[1] will be described with reference to FIGS. 9 to 11. FIGS. 9 and 11 are waveform diagrams illustrating the operation of the sense amplifier block (when a signal is read out to the DL[1]). FIGS. 10A and 10B are diagrams illustrating operation of each component in the sense amplifier block 4.

When a signal corresponding to the data value 1 is read out to the data line DL[1], a sense amplifier operation as illustrated in FIG. 9 is performed.

Immediately before timing t21, the sense amplifier block 4 maintains the switches AX[0] to AX[k] and AX[k+1] to AX[2k] of the selectors SEL1 and SEL2, respectively, in an OFF state as illustrated in FIG. 10A. In addition, the sense amplifier block 4 maintains the switches SW1 to SW8 in an OFF state. As a result, the potentials of the data lines DL[0] and DL[1], the one ends of the capacitive elements C1 and C2, and the other ends of the capacitive elements C1 and C2 are all at the reference level (for example, the ground level).

At timing t21, the sense amplifier block 4 turns on the switches SW1 to SW4 as illustrated in FIG. 10A. As a result, the data line DL[0], the data line DL[1], one end of the capacitive element C1, and one end of the capacitive element C2 are connected, the reference voltage Vref is supplied from the voltage generation circuit 5 to the data lines DL[0] and DL[1] and the one ends of the capacitive elements C1 and C2, and the potential thereof rises. That is, the electric charge is accumulated in the parasitic capacitance of the data line DL[0], the parasitic capacitance of the data line DL[1], one end of the capacitive element C1, and one end of the capacitive element C2 by the voltage generation circuit 5. As a result, the potential of the data line DL[0], the potential of the data line DL[1], the potential Vs[0] at one end of the capacitive element C1, and the potential Vs[1] at one end of the capacitive element C2 are equipotential to each other, and all are substantially equal to the level of the reference voltage Vref. Thus, the reference for comparison by the sense amplifier (comparator) 41 is equally set.

When the data lines DL[0] and DL[1] and the one ends of the capacitive elements C1 and C2 reach the level of the reference voltage Vref at timing t22, the sense amplifier block 4 turns off the switches SW1 and SW2 at timing t23 as illustrated in FIG. 10B. As a result, each of the data line DL[0], the data line DL[1], one end of the capacitive element C1, and one end of the capacitive element C2 is in a floating state while being held at the level of the reference voltage Vref.

At timing t24, the sense amplifier block 4 turns on the switch SW5 while maintaining the switch SW6 in an OFF state as illustrated in FIG. 10B. As a result, the pulse A having the amplitude of the positive potential is supplied from the pulse A generation circuit 6 to the other end of the capacitive element C1, and the potential Vs[0] at the other end of the capacitive element C1 is shifted to the positive side by an amount corresponding to the amplitude $V_1$ of the pulse A to reach $V_{11}$ (>0) as indicated by a dot-and-dash line in FIG. 9.

As a result, the sense amplifier block 4 redistributes the electric charge accumulated in the data line DL[0] and one end of the capacitive element C1 according to the ratio between the parasitic capacitance value of the data line DL[0] and the capacitance value of the capacitive element C1. In response to this, the potential of the data line DL[0] is shifted in a direction in which the amplitude increases by a shift amount ΔVref1 corresponding to the shift amount of the potential Vs[0] to reach $V_{12}$ (>Vref) as indicated by a dot-and-dash line in FIG. 9. That is, the following Expression 10 is established.

$$\Delta V\text{ref1} = V_{12} - V\text{ref} = k_1 \times (V_{11} - 0) \qquad \text{Expression 10}$$

In Expression 10, the shift amount ΔVref1 is an absolute value of the shift amount and is a positive value. $k_1$ is a positive coefficient that changes depending on the capacitance value of the capacitive element C1 (for example, in proportion to the capacitance value of the capacitive element C1), and has a larger value as the capacitance value of the capacitive element C1 is larger.

At timing t25, as illustrated in FIG. 10B, the sense amplifier block 4 selectively turns on one switch AX[k+1] of the plurality of switches AX[k+1] to AX[2k] in the selector SEL2. Accordingly, one selected local data line LDL[k+1] of the plurality of local data lines LDL[k+1] to LDL[2k] is connected to the data line DL[1].

When the data value 1 is stored in the memory cell MC, a signal corresponding to the data value 1 is read out from the memory cell MC to the data line DL[1] via the selected bit line BL and the selected local data line LDL, and the potential of the data line DL[1] rises from the level of the reference voltage Vref.

At timing t26, the potential of the data line DL[1] reaches the level $V_{13}$ increased by the voltage $\Delta V_{MC1}$ corresponding to the data value 1 from the level of the reference voltage Vref. That is, the following Expression 11 is established.

$$V_{13} = V\text{ref} + \Delta V_{MC11} \qquad \text{Expression 11}$$

At timing t27, the sense amplifier block 4 turns on the switch SW8 while maintaining the switch SW7 in an OFF state as illustrated in FIG. 10B. As a result, the pulse B having the amplitude of the negative potential is supplied from the pulse B generation circuit 7 to the other end of the capacitive element C2, and the potential Vs[1] at the other end of the capacitive element C2 is shifted to the negative side by an amount corresponding to the amplitude of the pulse B to reach $V_{14}$ (<0) as indicated by the solid line in FIG. 9.

As a result, the sense amplifier block 4 redistributes the electric charge accumulated in the data line DL[1] and one end of the capacitive element C1 according to the ratio between the parasitic capacitance value of the data line DL[1] and the capacitance value of the capacitive element C1. Accordingly, as indicated by a solid line in FIG. 9, the potential of the data line DL[1] is shifted in a direction in which the amplitude decreases by a shift amount ΔVs1 proportional to the shift amount of the potential Vs[1] to reach $V_{15}$ (<$V_{13}$). That is, the following Expression 12 is established.

$$\Delta V\text{s1} = V_{13} - V_{15} = k_1 \times (0 - V_{14}) \qquad \text{Expression 12}$$

In Expression 12, the shift amount ΔVs1 is an absolute value of the shift amount and is a positive value. $k_1$ is a positive coefficient that changes depending on the capacitance value of the capacitive element C1, and has a larger value as the capacitance value of the capacitive element C1 is larger.

When the sense amplifier enable signal SAE is at the active level at timing t28, the sense amplifier 41 compares the level of the data line DL[1] with the level of the data line DL[0] at timing t29.

At this time, a signal amount $\Delta S_{11}$, which is a level difference between the signal for the data value 1 and the reference voltage, is expressed by the following Expression 13.

$$\Delta S_{11} = V_{15} - V_{12} \qquad \text{Expression 13}$$

According to Expressions 10 to 12, Expression 13 can be transformed into the following Expression 14.

$$\Delta S_{11} = \Delta V_{MC11} - \Delta V\text{ref1} - \Delta Vs1 \qquad \text{Expression 14}$$

As illustrated in FIG. 9 and Expression 14, the signal amount $\Delta S_{11}$ for the data value 1 is reduced by the amount by which the shift amount $\Delta V\text{ref1}$ of the data line DL[0] and the shift amount $\Delta Vs1$ of the data line DL[1] are subtracted from the voltage $\Delta V_{MC11}$ corresponding to the data value 1, but is secured at a level sufficient for the comparison operation of the sense amplifier 41.

As a result, the sense amplifier 41 can detect that the level of the data line DL[1] is higher than the level of the data line DL[0], and can output the comparison result SAOUT of the L level. The comparison result SAOUT of the L level indicates that the data value 1 is detected by the sense amplifier 41. That is, in a case where a signal is read out to the data line DL[1], the data line DL[1] is connected to the inverting input terminal (−) of the sense amplifier 41 (comparator). Therefore, a value 1 logically inverted with respect to the comparison result SAOUT=L level (or 0) of the sense amplifier 41 is a data value to be detected.

On the other hand, in a case where a signal corresponding to the data value 0 is read out to the data line DL[1], a sense amplifier operation as illustrated in FIG. 11 is performed.

At timings t31 to t34, the sense amplifier block 4 performs the operation same as that at timings t21 to t24 illustrated in FIG. 9.

At timing t35, as illustrated in FIG. 10B, the sense amplifier block 4 selectively turns on one switch AX[k+1] of the plurality of switches AX[k+1] to AX[2k] in the selector SEL2. Accordingly, one selected local data line LDL[k+1] of the plurality of local data lines LDL[k+1] to LDL[2k] is connected to the data line DL[1].

When the data value 0 is stored in the memory cell MC, a signal corresponding to the data value 0 is read out from the memory cell MC to the data line DL[1] via the selected bit line BL and the selected local data line LDL. At timing t36, the potential of the data line DL[1] reaches the level $V_{16}$ changed by the voltage $\Delta V_{MC10}$ ($\approx 0$) corresponding to the data value 0 with respect to the level of the reference voltage Vref. That is, the following Expression 15 is established.

$$V_{16} = V\text{ref} + \Delta V_{MC10} \approx V\text{ref} \qquad \text{Expression 15}$$

At timing t37, the sense amplifier block 4 turns on the switch SW8 while maintaining the switch SW7 in an OFF state as illustrated in FIG. 10B. As a result, the pulse B having the amplitude of the negative potential is supplied from the pulse B generation circuit 7 to the other end of the capacitive element C2, and the potential Vs[1] at the other end of the capacitive element C2 is shifted to the negative side by an amount corresponding to the amplitude of the pulse B to reach $V_{14}$ (<0) as indicated by the solid line in FIG. 11.

As a result, the sense amplifier block 4 redistributes the electric charge accumulated in the data line DL[1] and one end of the capacitive element C1 according to the ratio between the parasitic capacitance value of the data line DL[1] and the capacitance value of the capacitive element C1. Accordingly, as indicated by a solid line in FIG. 11, the potential of the data line DL[1] is shifted in a direction in which the amplitude decreases by a shift amount $\Delta Vs1$ proportional to the shift amount of the potential Vs[1] to reach $V_{15}$ ($<V_{13}$). That is, the following Expression 16 is established.

$$\Delta Vs1 = V_{16} - V_{17} = k_1 \times (V_{14} - 0) \qquad \text{Expression 16}$$

In Expression 16, the shift amount $\Delta Vs1$ is an absolute value of the shift amount and is a positive value. $k_1$ is a positive coefficient that changes depending on the capacitance value of the capacitive element C1, and has a larger value as the capacitance value of the capacitive element C1 is larger.

When the sense amplifier enable signal SAE is at the active level at timing t38, the sense amplifier 41 compares the level of the data line DL[1] with the level of the data line DL[0] at timing t39.

At this time, a signal amount $\Delta S_{10}$, which is a level difference between the signal for the data value 0 and the reference voltage, is expressed by the following Expression 17.

$$\Delta S_{10} = V_{12} - V_{17} \qquad \text{Expression 17}$$

According to Expressions 10 to 12, 15, and 16, Expression 17 can be transformed into the following Expression 18.

$$\Delta S_{10} = \Delta V_{MC10} + \Delta V\text{ref1} + \Delta Vs1 \qquad \text{Expression 18}$$

As illustrated in FIG. 11 and Expression 18, the signal amount $\Delta S_{10}$ for the data value 0 is increased by the addition of the shift amount $\Delta V\text{ref1}$ of the data line DL[0] and the shift amount $\Delta Vs1$ of the data line DL[1] with respect to the voltage $\Delta V_{MC10}$ ($\approx 0$) corresponding to the data value 0, and is secured at a level sufficient for the comparison operation of the sense amplifier 41.

As a result, the sense amplifier 41 can detect that the level of the data line DL[1] is lower than the level of the data line DL[0], and can output the comparison result SAOUT of the H level. A comparison result SAOUT of the H level indicates that the data value 0 is detected by the sense amplifier 41. That is, the value 0 logically inverted with respect to the comparison result SAOUT=H level (or 1) of the sense amplifier 41 is a data value to be detected.

For example, in a case where there is no supply of the pulse B having the negative potential amplitude to the sense amplifier block 4, the signal amount $\Delta S_1'$ when the signal corresponding to the data value 1 is read out to the data line DL[0] is expressed by the following Expression with $\Delta Vs=0$ in Expression 5.

$$\Delta S_1' = \Delta V_{MC1} - \Delta V\text{ref} \qquad \text{Expression 5'}$$

The signal amount $\Delta S_0'$ when the signal corresponding to the data value 0 is read out to the data line DL[0] is expressed by the following Expression with $\Delta Vs=0$ in Expression 9.

$$\Delta S_0' = \Delta V_{MC0} + \Delta V\text{ref} \qquad \text{Expression 9'}$$

At this time, since $\Delta V_{MC0} \approx 0$, in order to secure the signal amount $\Delta S_0'$, it is required to secure a large capacitance value of the capacitive element C2, set $k_2$ indicated in Expression 1 to a large value, and increase the $\Delta V\text{ref}$. The capacitance value of the capacitive element C2 at this time is represented by Cref.

In addition, in a case where the pulse B is not supplied, the signal amount $\Delta S_{11}'$ when the signal corresponding to the data value 1 is read out to the data line DL[1] is expressed by the following Expression with $\Delta V s1=0$ in Expression 14.

$$\Delta S_{11}{}' = \Delta V_{MC11} - \Delta V \text{ref1} \qquad \text{Expression 14'}$$

The signal amount $\Delta S_{10}{}'$ at the time when the signal corresponding to the data value 0 is read out to the data line DL[1] is expressed by the following Expression with $\Delta V s1=0$ in Expression 18.

$$\Delta S_{10}{}' = \Delta V_{MC10} + \Delta V \text{ref1} \qquad \text{Expression 18'}$$

At this time, since $\Delta V_{MC10} \approx 0$, in order to secure the signal amount $\Delta S_{10}{}'$, it is required to secure a large capacitance value of the capacitive element C1, set $k_1$ indicated in Expression 10 to a large value, and increase the $\Delta V$ref1. The capacitance value of the capacitive element C1 at this time is represented by Cref.

Figure 12A:
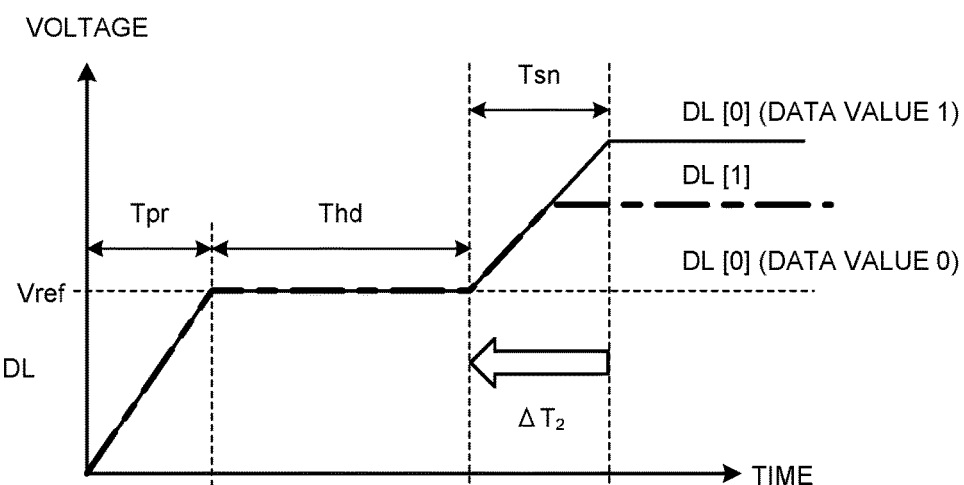
FIGS. 12A and 12B are diagrams illustrating an increase in speed of the sense amplifier operation according to the capacitance value of the capacitive element.

That is, when the pulse B is not supplied, the capacitance values of the capacitive elements C1 and C2 are set to a relatively large value Cref. Therefore, as illustrated in FIG. 12A, the length of a period Tpr in which electric charges are accumulated in the parasitic capacitance of the data line DL[0], the parasitic capacitance of the data line DL[1], one end of the capacitive element C1, and one end of the capacitive element C2 to make the potentials equipotential at the reference voltage Vref is prolonged. In addition, after the potentials are held at the reference voltage Vref for the predetermined period Thd, the parasitic capacitance of the data line DL[1] and one end of the capacitive element C2 are shifted at a level corresponding to the amplitude of the pulse A, and the length of a period Tsn in which electric charges are accumulated in the parasitic capacitance of the data line DL[0] and one end of the capacitive element C1 to have the potential corresponding to the signal level is prolonged.

Figure 12B:
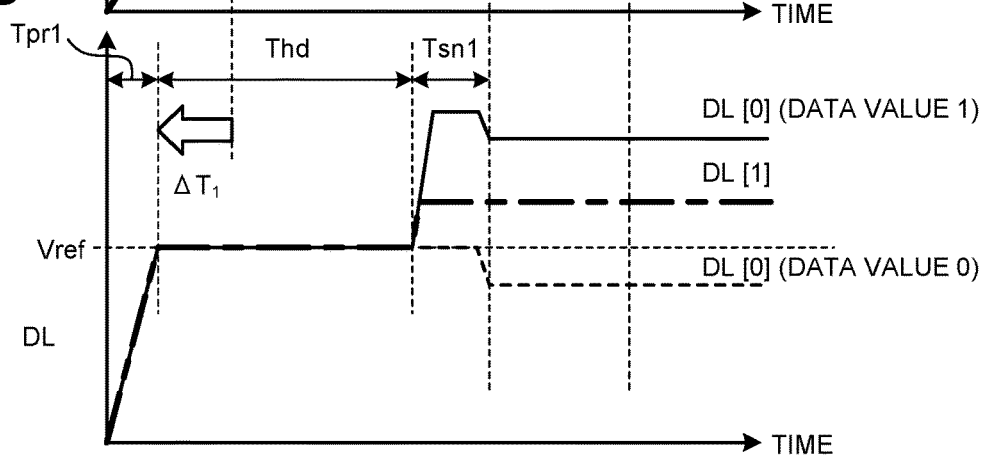

On the other hand, since there is the supply of the pulse B, the securing of a signal amount $\Delta S_0$ expressed by Expression 9 can be shared by a $\Delta V$ref and a $\Delta V$s, and the securing of the signal amount $\Delta S_{10}$ expressed by Expression 18 can be shared by a $\Delta V$ref1 and a $\Delta V$s1, $k_2$ represented by Expression 1 and $k_1$ represented by Expression 10 can be set to values about half of those in a case where there is no supply of the pulse B, and the capacitance values of the capacitive elements C1 and C2 can be set to half the value, that is Cref/2. Therefore, as illustrated in FIG. 12B, the length of a period Tpr1 in which electric charges are accumulated in the parasitic capacitance of the data line DL[0], the parasitic capacitance of the data line DL[1], one end of the capacitive element C1, and one end of the capacitive element C2 to make the potentials equipotential at the reference voltage Vref can be shortened (for example, to less than or equal to half). In addition, after the potentials are held at the reference voltage Vref for the predetermined period Thd, the parasitic capacitance of the data line DL[1] and one end of the capacitive element C2 are shifted at a level corresponding to the amplitude of the pulse A, and electric charge are accumulated in the parasitic capacitance of the data line DL[0] and one end of the capacitive element C1 to have a potential corresponding to the signal level, and the length of a period Tsn1 in which the potential is shifted at the level corresponding to the amplitude of the pulse B can be shortened (for example, to less than or equal to half). FIGS. 12A and 12B are diagrams illustrating an increase in speed of the sense amplifier operation according to the capacitance value of the capacitive element; FIG. 12A illustrates a sense amplifier operation when a signal is read out to the data line DL[0] in a case where the capacitance values of the capacitive elements C1 and C2 are a relatively large value Cref, and FIG. 12B illustrates a sense amplifier operation when a signal is read out to the data line DL[0] in a case where the capacitance values of the capacitive elements C1 and C2 are a small value Cref/2.

Since there is the supply of the pulse B, the timing at which the equipotential is completed can be advanced by $\Delta T_1$, and the timing at which the preparation for the comparison operation by the sense amplifier 41 is completed can be advanced by $\Delta T_2$, as indicated by white arrows in FIGS. 12A and 12B.

As described above, in the present embodiment, in the sense amplifier operation, the semiconductor storage device 1 supplies the positive potential pulse to the other end of the capacitive element in which the reference voltage Vref is accumulated and supplies the negative potential pulse to the other end of the capacitive element in which the signal is accumulated. As a result, the signal amount can be secured while speeding up the sense amplifier operation.

In the operation illustrated in FIG. 6, the operation at timing t4, the operation at timing t5, and the operation at timing t7 may be completed by timing t8 at which the sense amplifier enable signal SAE is active. In addition, the order of the operation at timing t4, the operation at timing t5, and the operation at timing t7 may be changed.

In the operation illustrated in FIG. 8, the operation at timing t14, the operation at timing t15, and the operation at timing t17 may be completed by timing t18 at which the sense amplifier enable signal SAE is active. In addition, the order of the operation at timing t14, the operation at timing t15, and the operation at timing t17 may be changed.

In the operation illustrated in FIG. 9, the operation at timing t24, the operation at timing t25, and the operation at timing t27 may be completed by timing t28 at which the sense amplifier enable signal SAE is active. In addition, the order of the operation at timing t24, the operation at timing t25, and the operation at timing t27 may be changed.

In the operation illustrated in FIG. 11, the operation at timing t34, the operation at timing t35, and the operation at timing t37 may be completed by timing t38 at which the sense amplifier enable signal SAE is active. In addition, the order of the operation at timing t34, the operation at timing t35, and the operation at timing t37 may be changed.

Figure 13:
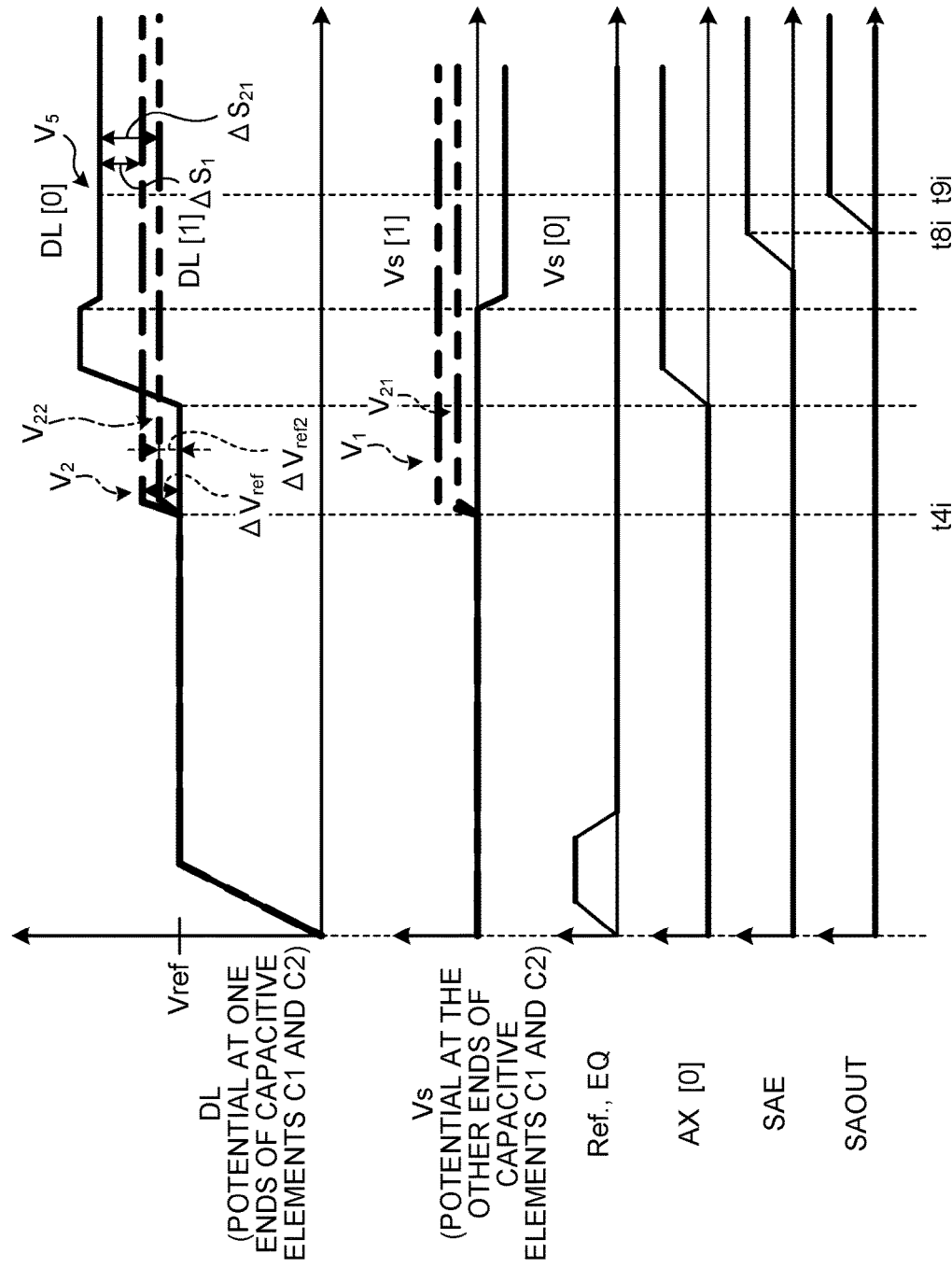
FIG. 13 is a waveform diagram illustrating an operation of the sense amplifier block according to the first modification of the embodiment.
Figure 14:
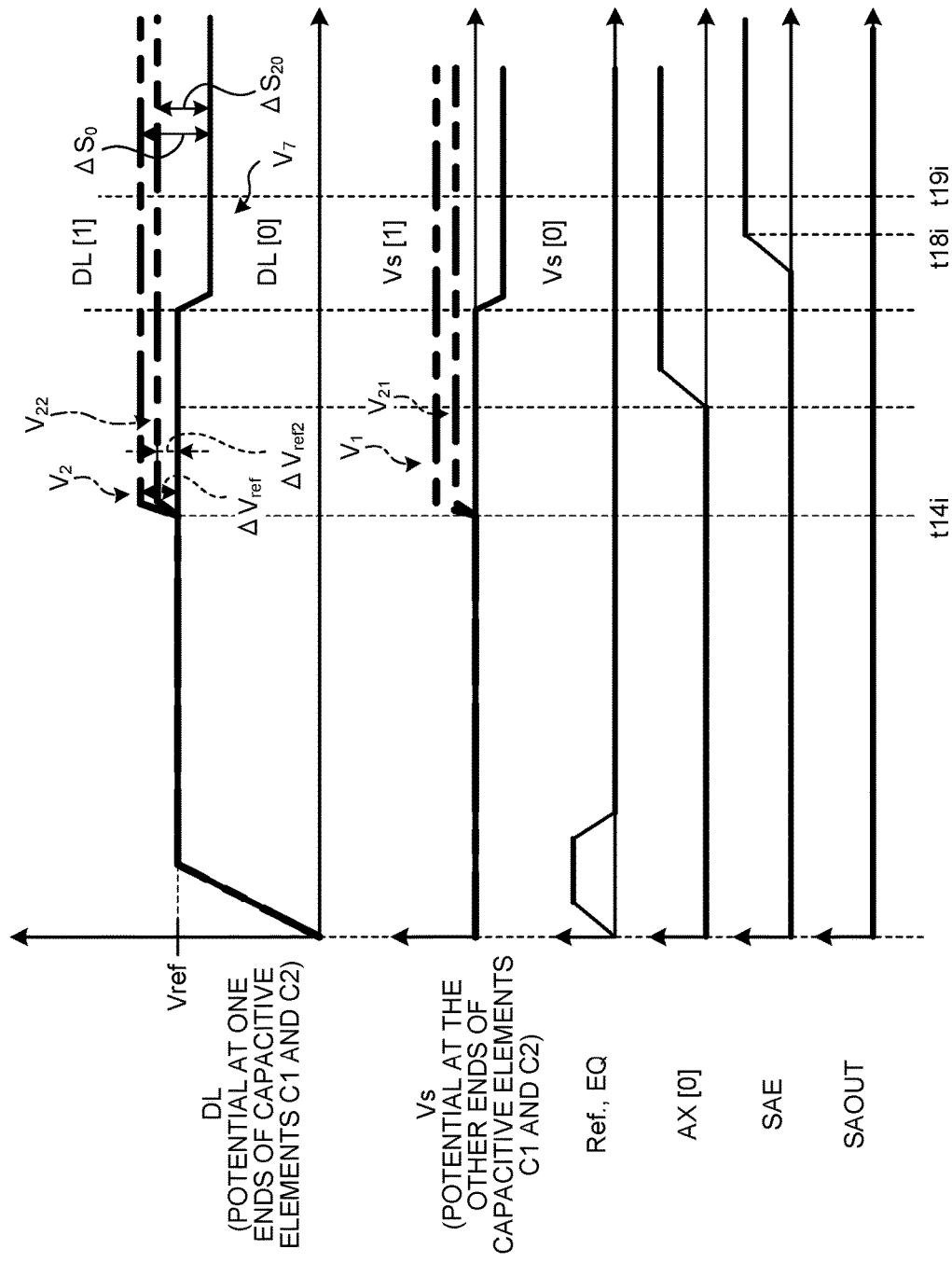
FIG. 14 is a waveform diagram illustrating an operation of the sense amplifier block according to the first modification of the embodiment.

Alternatively, the positive potential amplitude of the pulse A supplied to the sense amplifier block 4 may be variable. For example, as illustrated in FIGS. 13 and 14, the pulse A generation circuit 6 may have $V_1$ and $V_{21}$ as candidates for the positive potential amplitude of the pulse A. FIGS. 13 and 14 are waveform diagrams illustrating an operation of the sense amplifier block in the first modification of the embodiment. $V_{21}$ is, for example, an amplitude value satisfying $$0 < V_{21} < V_1 \qquad \text{Expression 19.}$$

Immediately before the timings t4$i$ and t14$i$, the semiconductor storage device 1 identifies, from a bit error rate or the like for the data value obtained in the previous sense amplifier operation, in which sense amplifier operation of the data value 1 and the data value 0 a bit error is likely to occur. The semiconductor storage device 1 controls the pulse A generation circuit 6 so as so as to generate the pulse A with an amplitude according to the identified result. The pulse A generation circuit 6 generates the pulse A with an amplitude according to control from the semiconductor storage device 1 to supply the generated pulse A to the sense amplifier block 4.

In a case where the pulse A with the amplitude $V_{21}$ is supplied, the sense amplifier block 4 turns on the switch SW7 while maintaining the switch SW8 in an OFF state as illustrated in FIG. 7B at timing t4$i$ illustrated in FIG. 13. As a result, the pulse A having the amplitude $V_{21}$ of the positive potential is supplied from the pulse A generation circuit 6 to the other end of the capacitive element C2, and the potential Vs[1] of the other end of the capacitive element C2 is shifted to the positive side by an amount corresponding to the amplitude $V_{21}$ of the pulse A to reach $V_{21}$ (>0) as indicated by a two-dot chain line in FIG. 13.

As a result, the sense amplifier block 4 redistributes the electric charge accumulated in the data line DL[1] and one end of the capacitive element C2 according to the ratio between the parasitic capacitance value of the data line DL[1] and the capacitance value of the capacitive element C2. Accordingly, as indicated by a two-dot chain line in FIG. 13, the potential of the data line DL[1] is shifted in a direction in which the amplitude increases by a shift amount $\Delta$Vref2 corresponding to the shift amount of the potential Vs[1] to reach $V_{22}$ (>Vref). That is, the following Expression 20 is established.

$$\Delta Vref2 = V_{22} - Vref = k_2 \times (V_{21} - 0) \qquad \text{Expression 20}$$

At this time, the following Expression 21 is established from Expressions 19 and 20.

$$0 < \Delta Vref2 < \Delta Vref \qquad \text{Expression 21}$$

When the sense amplifier enable signal SAE is at the active level at timing t8$i$, the sense amplifier 41 compares the level of the data line DL[0] with the level of the data line DL[1] at timing t9$i$.

At this time, a signal amount $\Delta S_{21}$, which is a level difference between the signal for the data value 1 and the reference voltage, is expressed by the following Expression 22.

$$\Delta S_{21} = V_5 - V_{22} \qquad \text{Expression 22}$$

According to Expressions 2, 3, and 20, Expression 22 can be transformed into the following Expression 23.

$$\Delta S_{21} = \Delta V_{MC1} - \Delta Vref2 - \Delta Vs \qquad \text{Expression 23}$$

The following Expression 24 is established from Expressions 5, 21, and 23.

$$\Delta S_1 < \Delta S_{21} \qquad \text{Expression 24}$$

In a case where the pulse A with the amplitude $V_{21}$ is supplied, the sense amplifier block 4 turns on the switch SW7 while maintaining the switch SW8 in an OFF state as illustrated in FIG. 7B at timing t14$i$ illustrated in FIG. 14. As a result, the pulse A having the amplitude $V_{21}$ of the positive potential is supplied from the pulse A generation circuit 6 to the other end of the capacitive element C2, and the potential Vs[1] of the other end of the capacitive element C2 is shifted to the positive side by an amount corresponding to the amplitude $V_{21}$ of the pulse A to reach $V_{21}$ (>0) as indicated by a two-dot chain line in FIG. 14.

As a result, the sense amplifier block 4 redistributes the electric charge accumulated in the data line DL[1] and one end of the capacitive element C2 according to the ratio between the parasitic capacitance value of the data line DL[1] and the capacitance value of the capacitive element C2. Accordingly, as indicated by a two-dot chain line in FIG. 14, the potential of the data line DL[1] is shifted in a direction in which the amplitude increases by a shift amount $\Delta$Vref2 corresponding to the shift amount of the potential Vs[1] to reach $V_{22}$ (>Vref). That is, the following Expression 25 is established.

$$\Delta Vref2 = V_{22} - Vref = k_1 \times (V_{21} - 0) \qquad \text{Expression 25}$$

At this time, the following Expression 26 is established from Expressions 19 and 25.

$$0 < \Delta Vref2 < \Delta Vref \qquad \text{Expression 26}$$

When the sense amplifier enable signal SAE is at the active level at timing t18$i$, the sense amplifier 41 compares the level of the data line DL[0] with the level of the data line DL[1] at timing t19$i$.

At this time, a signal amount $\Delta S_{20}$, which is a level difference between the signal for the data value 0 and the reference voltage, is expressed by the following Expression 27.

$$\Delta S_{20} = V_{22} - V_7 \qquad \text{Expression 27}$$

According to Expressions 2, 3, and 25, Expression 27 can be transformed into the following Expression 28.

$$\Delta S_{21} = \Delta V_{MC0} + \Delta Vref2 + \Delta Vs \qquad \text{Expression 28}$$

The following Expression 29 is established from Expressions 9, 21, and 28.

$$\Delta S_0 > \Delta S_{20} \qquad \text{Expression 29}$$

Here, as shown in Expressions 24 and 29, in a case where the amplitude of the pulse A is controlled to $V_{21}$, the signal amount for the data value 1 increases, and the signal amount for the data value 0 decreases. Therefore, the semiconductor storage device 1 may control the pulse A generation circuit 6 so as to generate the pulse A with the amplitude $V_{21}$ in a case where the bit error is likely to occur in the data value 1, and may control the pulse A generation circuit 6 so as to generate the pulse A with the amplitude $V_1$ in a case where the bit error is likely to occur in the data value 0. As a result, the semiconductor storage device 1 can dynamically improve the bit error rate.

Figure 15:
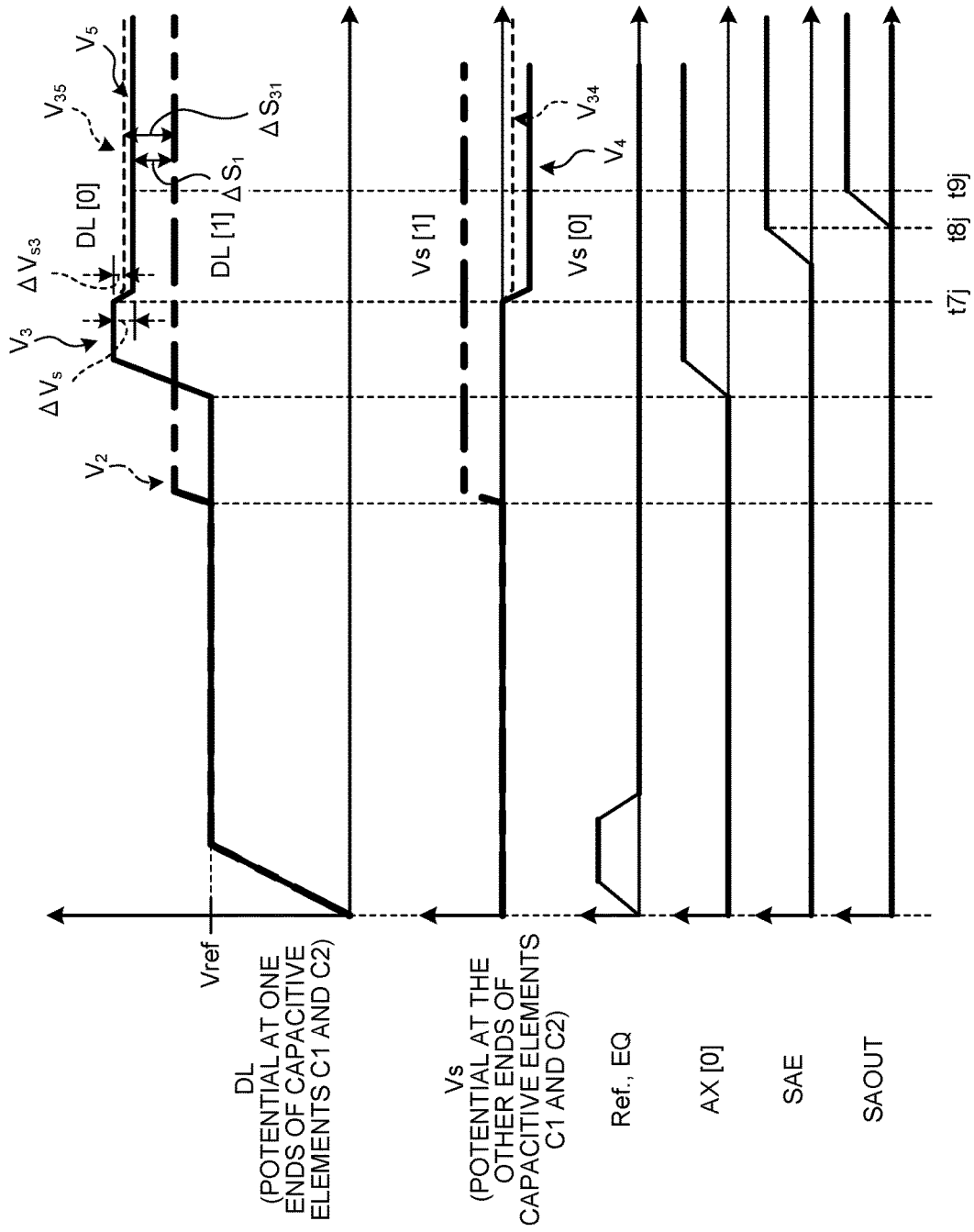
FIG. 15 is a waveform diagram illustrating an operation of the sense amplifier block according to the second modification of the embodiment.
Figure 16:
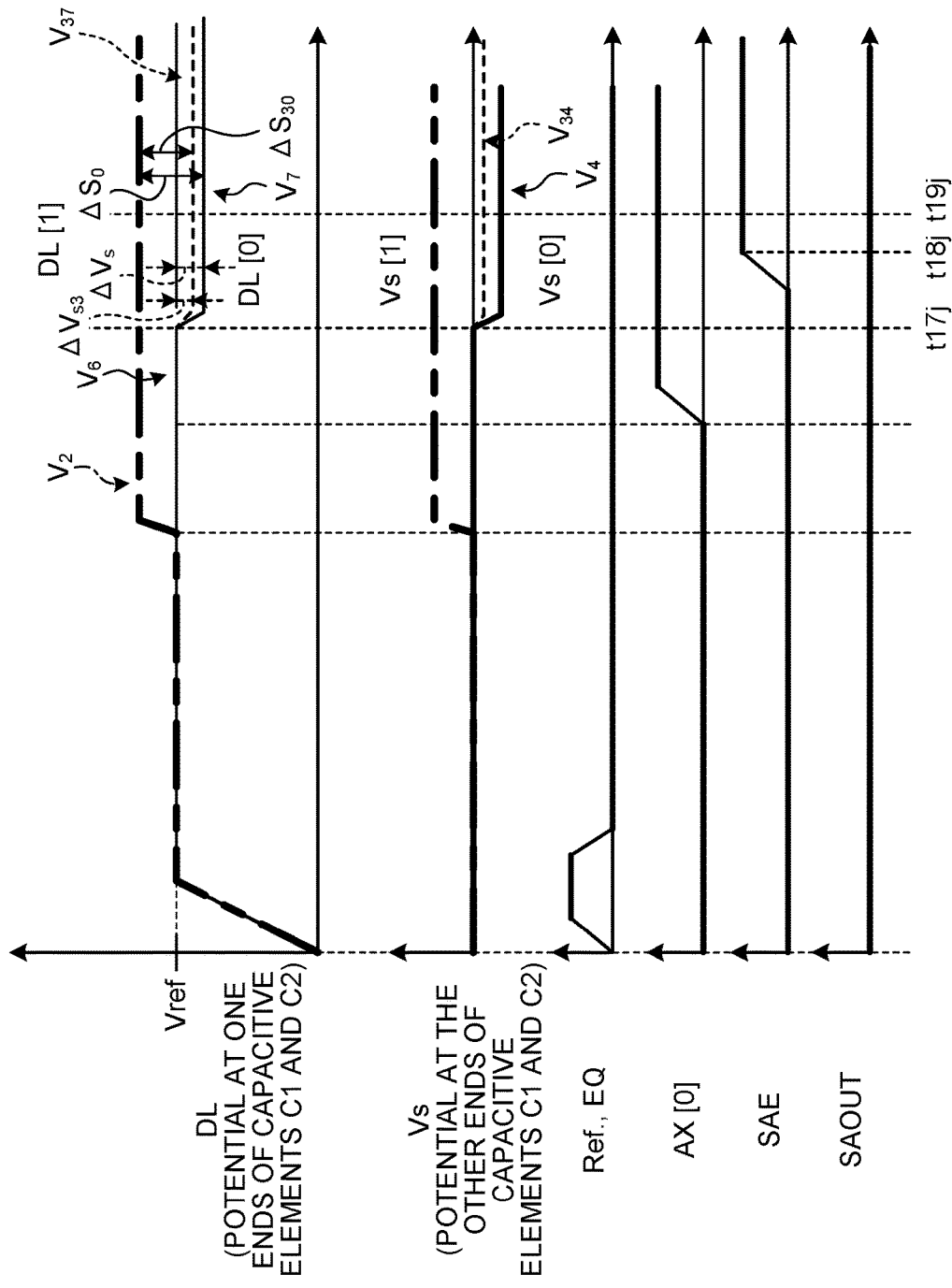
FIG. 16 is a waveform diagram illustrating an operation of the sense amplifier block according to the second modification of the embodiment.

Alternatively, the negative potential amplitude of the pulse B supplied to the sense amplifier block 4 may be variable. For example, as illustrated in FIGS. 15 and 16, the pulse B generation circuit 7 may have $V_4$ and $V_{34}$ as candidates for the negative potential amplitude of the pulse B. FIGS. 15 and 16 are waveform diagrams illustrating an operation of the sense amplifier block 4 in the second modification of the embodiment. $V_{34}$ is an amplitude value satisfying $$0 > V_{34} > V_4 \qquad \text{Expression 30.}$$

Immediately before the timings t7$j$ and t17$j$, the semiconductor storage device 1 identifies, from a bit error rate or the like for the data value obtained in the previous sense amplifier operation, in which sense amplifier operation of the data value 1 and the data value 0 a bit error is likely to occur. The semiconductor storage device 1 controls the pulse B generation circuit 7 so as to generate the pulse B with an amplitude according to the identified result. The pulse B generation circuit 7 generates the pulse B with an amplitude according to control from the semiconductor storage device 1 to supply the generated pulse B to the sense amplifier block 4.

In a case where the pulse B with the amplitude $V_{34}$ is supplied, the sense amplifier block 4 turns on the switch SW6 while maintaining the switch SW5 in an OFF state as illustrated in FIG. 7B at timing t7$j$ illustrated in FIG. 15. As a result, the pulse B having the amplitude $V_{34}$ of the negative potential is supplied from the pulse B generation circuit 7 to the other end of the capacitive element C1, and the potential Vs[1] at the other end of the capacitive element C1 is shifted to the negative side by an amount corresponding to the amplitude $V_{34}$ of the pulse B to reach $V_{34}$ (<0) as indicated by a dotted line in FIG. 15.

As a result, the sense amplifier block 4 redistributes the electric charge accumulated in the data line DL[0] and one end of the capacitive element C1 according to the ratio between the parasitic capacitance value of the data line DL[0] and the capacitance value of the capacitive element C1. Accordingly, as indicated by a dotted line in FIG. 15, the potential of the data line DL[0] is shifted in a direction in which the amplitude decreases by a shift amount $\Delta Vs3$ corresponding to the shift amount of the potential Vs[1] to reach $V_{35}$ ($<V_3$). That is, the following Expression 31 is established.

$$\Delta Vs3 = V_3 - V_{35} = k_1 \times (0 - V_{34}) \qquad \text{Expression 31}$$

At this time, the following Expression 32 is established from Expressions 30 and 31.

$$0 < \Delta Vs < \Delta Vs3 \qquad \text{Expression 32}$$

When the sense amplifier enable signal SAE is at the active level at timing t8j, the sense amplifier 41 compares the level of the data line DL[0] with the level of the data line DL[1] at timing t9j.

At this time, a signal amount $\Delta S_{31}$, which is a level difference between the signal for the data value 1 and the reference voltage, is expressed by the following Expression 33.

$$\Delta S_{31} = V_{35} - V_2 \qquad \text{Expression 33}$$

According to Expressions 2, 3, and 31, Expression 33 can be transformed into the following Expression 34.

$$\Delta S_{31} = \Delta V_{MC1} - \Delta V\text{ref} - \Delta Vs3 \qquad \text{Expression 34}$$

The following Expression 35 is established from Expressions 5, 32, and 34.

$$\Delta S_1 < \Delta S_{31} \qquad \text{Expression 35}$$

In a case where the pulse B with the amplitude $V_{34}$ is supplied, the sense amplifier block 4 turns on the switch SW6 while maintaining the switch SW5 in an OFF state as illustrated in FIG. 7B at timing t17j illustrated in FIG. 16. As a result, the pulse B having the amplitude $V_{34}$ of the negative potential is supplied from the pulse B generation circuit 7 to the other end of the capacitive element C1, and the potential Vs[0] of the other end of the capacitive element C1 is shifted to the negative side by an amount corresponding to the amplitude $V_{34}$ of the pulse B to reach $V_{34}$ ($<0$) as indicated by a dotted line in FIG. 16.

As a result, the sense amplifier block 4 redistributes the electric charge accumulated in the data line DL[0] and one end of the capacitive element C1 according to the ratio between the parasitic capacitance value of the data line DL[0] and the capacitance value of the capacitive element C1. Accordingly, as indicated by a dotted line in FIG. 16, the potential of the data line DL[0] is shifted in a direction in which the amplitude decreases by a shift amount $\Delta Vs3$ corresponding to the shift amount of the potential Vs[0] to reach $V_{37}$ ($<$Vref). That is, the following Expression 36 is established.

$$\Delta Vs3 = V_6 - V_{37} = k_1 \times (0 - V_{34}) \qquad \text{Expression 36}$$

At this time, the following Expression 37 is established from Expressions 30 and 36.

$$0 < \Delta Vs3 < \Delta Vs \qquad \text{Expression 37}$$

When the sense amplifier enable signal SAE is at the active level at timing t18j, the sense amplifier 41 compares the level of the data line DL[0] with the level of the data line DL[1] at timing t19j.

At this time, a signal amount $\Delta S_{30}$, which is a level difference between the signal for the data value 0 and the reference voltage, is expressed by the following Expression 38.

$$\Delta S_{30} = V_2 - V_{37} \qquad \text{Expression 38}$$

According to Expressions 2, 3, and 36, Expression 38 can be transformed into the following Expression 39.

$$\Delta S_{30} = \Delta V_{MC0} + \Delta V\text{ref} + \Delta Vs3 \qquad \text{Expression 39}$$

The following Expression 40 is established from Expressions 9, 32, and 39.

$$\Delta S_0 > \Delta S_{30} \qquad \text{Expression 40}$$

Here, as shown in Expressions 35 and 40, in a case where the amplitude of the pulse B is controlled to $V_{34}$, the signal amount for the data value 1 increases, and the signal amount for the data value 0 decreases. Therefore, the semiconductor storage device 1 may control the pulse B generation circuit 7 so as to generate the pulse B with the amplitude $V_{34}$ in a case where the bit error is likely to occur in the data value 1, and may control the pulse B generation circuit 7 so as to generate the pulse B with the amplitude $V_4$ in a case where the bit error is likely to occur in the data value 0. As a result, the semiconductor storage device 1 can dynamically improve the bit error rate.

Figure 17:
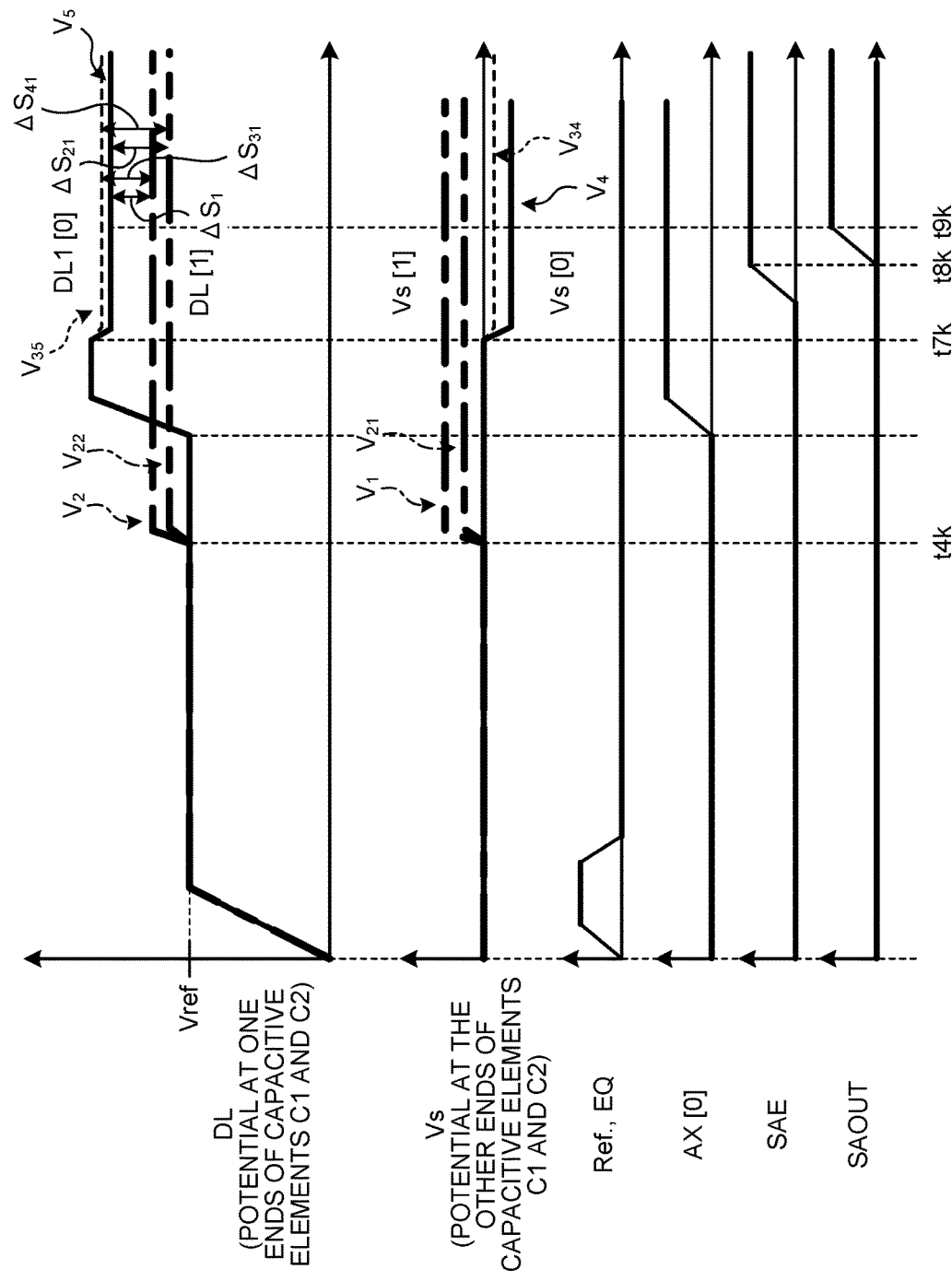
FIG. 17 is a waveform diagram illustrating an operation of the sense amplifier block according to the third modification of the embodiment.
Figure 18:
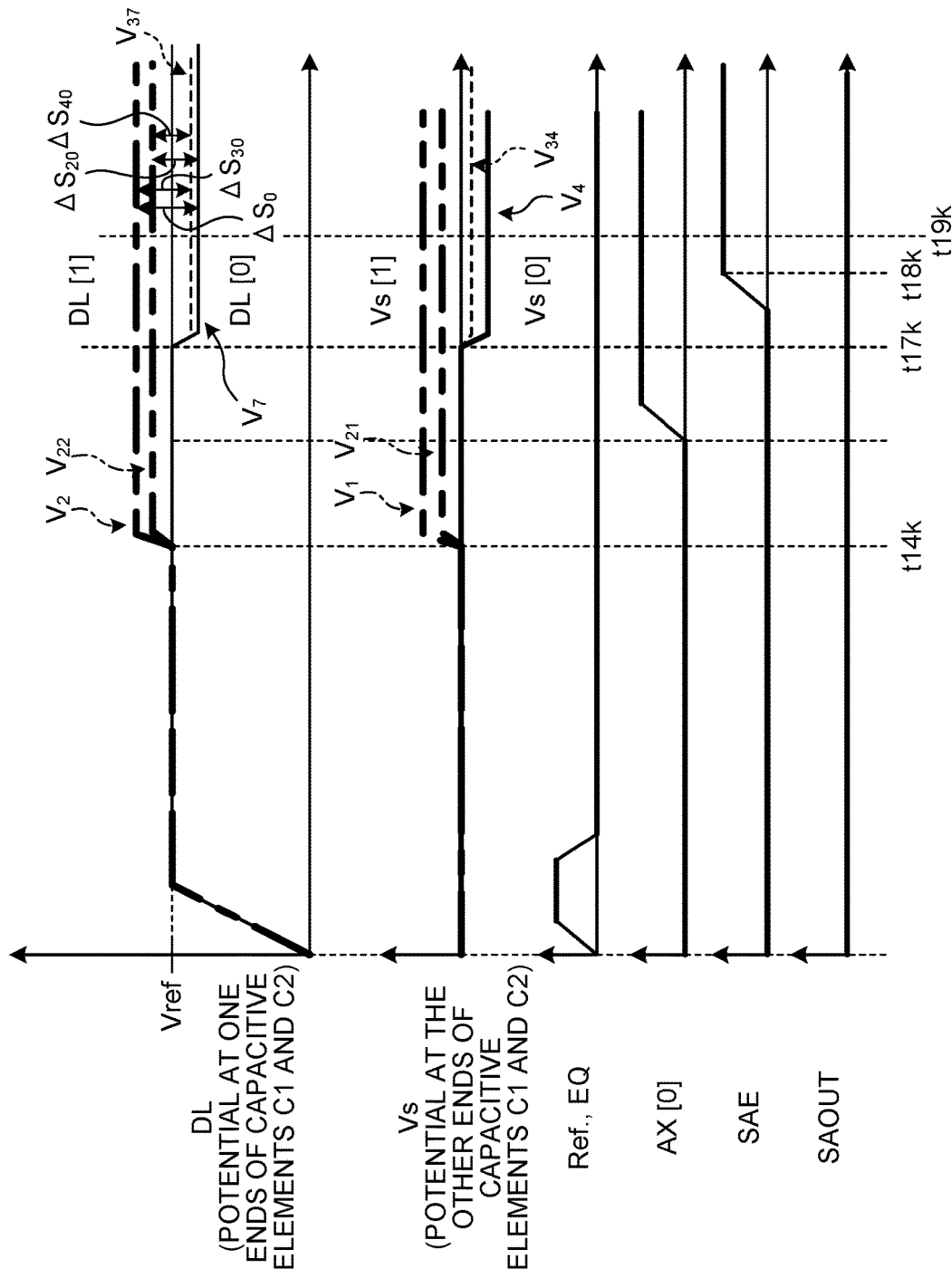
FIG. 18 is a waveform diagram illustrating an operation of the sense amplifier block according to the third modification of the embodiment.

Alternatively, the positive potential amplitude of the pulse A supplied to the sense amplifier block 4 may be variable, and the positive potential amplitude of the pulse B supplied to the sense amplifier block 4 may be variable. For example, as illustrated in FIGS. 17 and 18, the pulse A generation circuit 6 may have $V_1$ and $V_{21}$ as candidates for the positive potential amplitude of the pulse A, and the pulse B generation circuit 7 may have $V_4$ and $V_{34}$ as candidates for the negative potential amplitude of the pulse B. FIGS. 17 and 18 are waveform diagrams illustrating an operation of the sense amplifier block in the third modification of the embodiment. That is, as the third modification of the embodiment, an operation in which the operation of the first modification and the operation of the second modification are combined may be performed. Immediately before the timings t4k and t14k, the semiconductor storage device 1 identifies, from a bit error rate or the like for the data value obtained in the previous sense amplifier operation, in which sense amplifier operation of the data value 1 and the data value 0 a bit error is likely to occur. The semiconductor storage device 1 controls the pulse A generation circuit 6 so as to generate the pulse A with an amplitude according to the specified result, and controls the pulse B generation circuit 7 so as to generate the pulse B with an amplitude according to the identified result. The pulse A generation circuit 6 generates the pulse A with an amplitude according to control from the semiconductor storage device 1 to supply the generated pulse A to the sense amplifier block 4. The pulse B generation circuit 7 generates the pulse B with an amplitude according to control from the semiconductor storage device 1 to supply the generated pulse B to the sense amplifier block 4.

In a case where the pulse A with the amplitude $V_{21}$ is supplied and the pulse B with the amplitude $V_{34}$ is supplied, in the sense amplifier block 4, the potential Vs[1] at the other end of the capacitive element C2 is shifted to the positive side by an amount corresponding to the amplitude $V_{21}$ of the pulse A to reach $V_{21}$ ($>0$) at timing t4k illustrated in FIG. 17 as illustrated by a two-dot chain line in FIG. 17. As a result, the sense amplifier block 4 redistributes the electric charge accumulated in the data line DL[1] and one end of the capacitive element C2 according to the ratio between the parasitic capacitance value of the data line DL[1] and the capacitance value of the capacitive element C2. Accordingly, as indicated by a two-dot chain line in FIG. 18, the potential of the data line DL[1] is shifted in a direction in which the amplitude increases by a shift amount ΔVref2 corresponding to the shift amount of the potential Vs[1] to reach $V_{22}$ (>Vref).

At timing t17k, in the sense amplifier block 4, the potential Vs[0] at the other end of the capacitive element C1 is shifted to the negative side by an amount corresponding to the amplitude $V_{34}$ of the pulse B to reach $V_{34}$ (<0) as indicated by a dotted line in FIG. 18. As a result, the sense amplifier block 4 redistributes the electric charge accumulated in the data line DL[0] and one end of the capacitive element C1 according to the ratio between the parasitic capacitance value of the data line DL[0] and the capacitance value of the capacitive element C1. Accordingly, as indicated by a dotted line in FIG. 16, the potential of the data line DL[0] is shifted in a direction in which the amplitude decreases by a shift amount ΔVs3 corresponding to the shift amount of the potential Vs [0] to reach $V_{37}$ (<Vref). When the sense amplifier enable signal SAE is at the active level at timing t18k, the sense amplifier 41 compares the level of the data line DL[0] with the level of the data line DL[1] at timing t19k.

At this time, a signal amount $\Delta S_{41}$, which is a level difference between the signal for the data value 0 and the reference voltage, is expressed by the following Expression 41.

$$\Delta S_{44}=V_{35}-V_{22} \qquad \text{Expression 41}$$

In addition, in a case where the pulse A with the amplitude $V_{21}$ is supplied and the pulse B with the amplitude $V_{34}$ is supplied, in the sense amplifier block 4, the potential Vs[1] at the other end of the capacitive element C2 is shifted to the positive side by an amount corresponding to the amplitude $V_{21}$ of the pulse A to reach $V_{21}$ (>0) at timing t14k illustrated in FIG. 18 as illustrated by a two-dot chain line in FIG. 18. As a result, the sense amplifier block 4 redistributes the electric charge accumulated in the data line DL[1] and one end of the capacitive element C2 according to the ratio between the parasitic capacitance value of the data line DL[1] and the capacitance value of the capacitive element C2. Accordingly, as indicated by a two-dot chain line in FIG. 18, the potential of the data line DL[1] is shifted in a direction in which the amplitude increases by a shift amount ΔVref2 corresponding to the shift amount of the potential Vs[1] to reach $V_{22}$ (>Vref).

At timing t18k, in the sense amplifier block 4, the potential Vs[0] at the other end of the capacitive element C1 is shifted to the negative side by an amount corresponding to the amplitude $V_{34}$ of the pulse B to reach $V_{34}$ (<0) as indicated by a dotted line in FIG. 18. As a result, the sense amplifier block 4 redistributes the electric charge accumulated in the data line DL[0] and one end of the capacitive element C1 according to the ratio between the parasitic capacitance value of the data line DL[0] and the capacitance value of the capacitive element C1. Accordingly, as indicated by a dotted line in FIG. 18, the potential of the data line DL[0] is shifted in a direction in which the amplitude decreases by a shift amount ΔVs3 corresponding to the shift amount of the potential Vs[0] to reach $V_{37}$ (<Vref).

When the sense amplifier enable signal SAE is at the active level at timing t18k, the sense amplifier 41 compares the level of the data line DL[0] with the level of the data line DL[1] at timing t19k.

At this time, a signal amount $\Delta S_{40}$, which is a level difference between the signal for the data value 0 and the reference voltage, is expressed by the following Expression 42.

$$\Delta S_{40}=V_{22}-V_{37} \qquad \text{Expression 42}$$

That is, as illustrated in FIGS. 17 and 18 and Expressions 4, 8, 22, 27, 33, 38, 41, and 42, the sense amplifier block 4 can vary the signal amount in a plurality of stages by a combination of the amplitude of the supplied pulse A and the amplitude of the supplied pulse B. The sense amplifier block 4 may vary signal amounts $\Delta S_1$, $\Delta S_{31}$, $\Delta S_{21}$, and $\Delta S_{41}$ in four stages illustrated in FIG. 17 as signal amounts for the data value 1. The magnitude relationship of each signal amount can vary depending on how the amplitude level of the pulse A and the amplitude level of the pulse B are taken. As an example, the signal amount for the data value 1 may have a magnitude relationship expressed in Expression 43.

$$\Delta S_1<\Delta S_{31}<\Delta S_{21}<\Delta S_{41} \qquad \text{Expression 43}$$

Similarly, the sense amplifier block 4 may vary the signal amounts $\Delta S_0$, $\Delta S_{30}$, $\Delta S_{20}$, and $\Delta S_{40}$ in four stages illustrated in FIG. 18 as the signal amount for the data value 0. The magnitude relationship of each signal amount can vary depending on how the amplitude level of the pulse A and the amplitude level of the pulse B are taken. As an example, the signal amount for the data value 0 may have a magnitude relationship expressed in Expression 44.

$$\Delta S_0<\Delta S_{30}<\Delta S_{20}<\Delta S_{40} \qquad \text{Expression 44}$$

Figure 19:
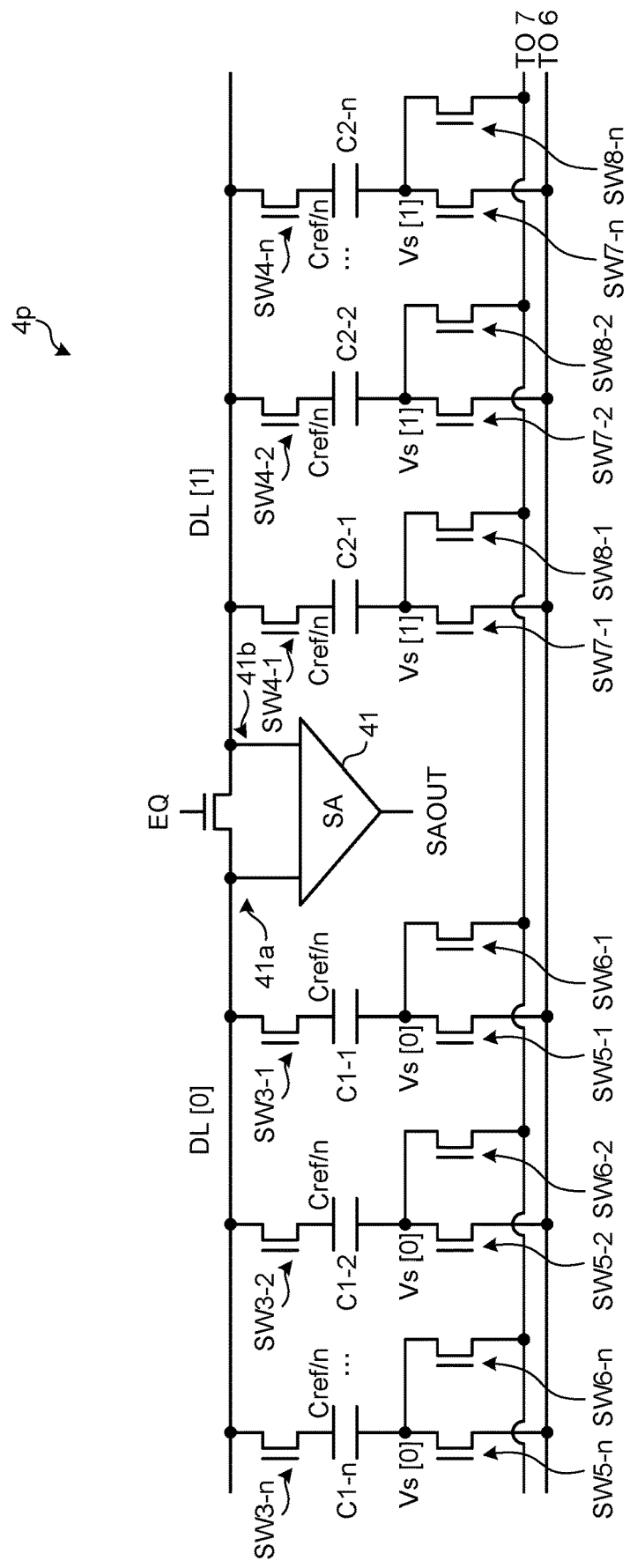
FIG. 19 is a diagram illustrating a configuration of the sense amplifier block according to the fourth modification of the embodiment.

Alternatively, as illustrated in FIG. 19, in the sense amplifier block 4p, the capacitance values of the capacitive elements connected to the two input nodes 41a and 41b of the sense amplifier 41 may be variable. FIG. 19 is a diagram illustrating a configuration of the sense amplifier block 4p according to the fourth modification of the embodiment.

When n is an arbitrary integer of 2 or more, the sense amplifier block 4p includes a plurality of capacitive elements C1-1 to C1-n, a plurality of capacitive elements C2-1 to C2-n, a plurality of switches SW3-1 to SW3-n, a plurality of switches SW4-1 to SW4-n, a plurality of switches SW5-1 to SW5-n, a plurality of switches SW6-1 to SW6-n, a plurality of switches SW7-1 to SW7-n, and a plurality of switches SW8-1 to SW8-n.

The plurality of capacitive elements C1-1 to C1-n corresponds to the plurality of switches SW3-1 to SW3-n, corresponds to the plurality of switches SW5-1 to SW5-n, and corresponds to the plurality of switches SW6-1 to SW6-n. Each of the capacitive elements C1-1 to C1-n is connected to the data line DL[0] via the corresponding switch SW3, connected to the pulse A generation circuit 6 via the corresponding switch SW5, and connected to the pulse B generation circuit 7 via the corresponding switch SW6. Each of the capacitive elements C1-1 to C1-n has an equal capacitance value, for example, Cref/n.

The plurality of capacitive elements C2-1 to C2-n corresponds to the plurality of switches SW4-1 to SW4-n, corresponds to the plurality of switches SW7-1 to SW7-n, and corresponds to the plurality of switches SW8-1 to SW8-n. Each of the capacitive elements C2-1 to C2-n is connected to the data line DL[1] via the corresponding switch SW4, connected to the pulse A generation circuit 6 via the corresponding switch SW7, and connected to the pulse B generation circuit 7 via the corresponding switch SW8. Each of the capacitive elements C2-1 to C2-n has an equal capacitance value, for example, Cref/n.

The sense amplifier block 4p can vary the combined capacitance value of the capacitive element C1 connected to the input node 41a of the sense amplifier 41 by controlling the number of switches to be turned on of the plurality of switches SW3-1 to SW3-n, and can vary the combined capacitance value of the capacitive element C2 connected to the input node 41a of the sense amplifier 41 by controlling the number of switches to be turned on of the plurality of switches SW4-1 to SW4-n. The sense amplifier block 4p can set the combined capacitance value of the capacitive element C1 connected to the input node 41a of the sense amplifier 41 to m×Cref/n by turning on the m switches SW3 (m is an integer of n or less), and can set the combined capacitance value of the capacitive element C2 connected to the input node 41b of the sense amplifier 41 to m×Cref/n by turning on the m switches SW4. As a result, the switching operation of the amplitudes of the data lines DL[0] and DL[1] as illustrated in FIGS. 13 to 18 can be realized by varying the combined capacitance value of the capacitive elements C1 and C2.

Figure 20:
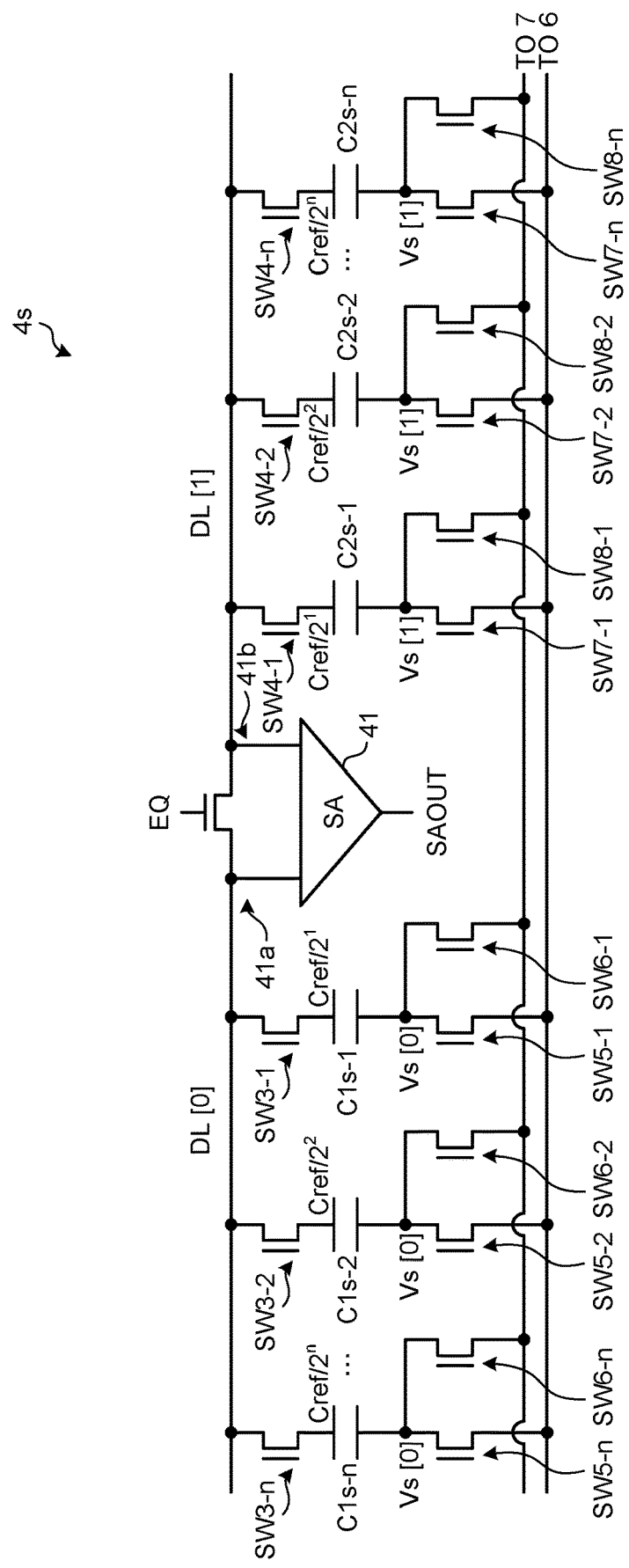
FIG. 20 is a diagram illustrating a configuration of the sense amplifier block according to the fifth modification of the embodiment.

Alternatively, unlike the configuration illustrated in FIG. 19, the sense amplifier block 4s may have a configuration in which capacitance values of a plurality of capacitive elements are varied to be different in binary as illustrated in FIG. 20. FIG. 20 is a diagram illustrating a configuration of a sense amplifier block 4s according to the fifth modification of the embodiment. The sense amplifier block 4s includes a plurality of capacitive elements C1s-1 to C1s-n and a plurality of capacitive elements C2s-1 to C2s-n in place of the plurality of capacitive elements C1-1 to C1-n and the plurality of capacitive elements C2-1 to C2-n (see FIG. 19). The plurality of capacitive elements C1s-1, C1s-2, . . . , and C1s-n has capacitance values different from each other, which are $Cref/2^1$, $Cref/2^2$, . . . , and $Cref/2^n$, respectively. The plurality of capacitive elements C2s-1, C2s-2, . . . , and C2s-n has capacitance values different from each other, which are $Cref/2^1$, $Cref/2^2$, . . . , and $Cref/2^n$, respectively.

The combined capacitance value of the capacitive element C1 connected to the input node 41a of the sense amplifier 41 can be varied in a binary manner by controlling a switch to be turned on of the plurality of switches SW3-1 to SW3-n, and the combined capacitance value of the capacitive element C2 connected to the input node 41a of the sense amplifier 41 can be varied in a binary manner by controlling a switch to be turned on of the plurality of switches SW4-1 to SW4-n.

The sense amplifier block 4p can set the combined capacitance value of the capacitive element C1 connected to the input node 41a of the sense amplifier 41 to Cref/4 by selectively turning on the switch SW3-2 of the plurality of switches SW3-1 to SW3-n, and can set the combined capacitance value of the capacitive element C2 connected to the input node 41b of the sense amplifier 41 to Cref/4 by selectively turning on the switch SW4-2 of the plurality of switches SW4-1 to SW4-n.

The sense amplifier block 4p can set the combined capacitance value of the capacitive element C1 connected to the input node 41a of the sense amplifier 41 to Cref/2 by selectively turning on the switch SW3-1 of the plurality of switches SW3-1 to SW3-n, and can set the combined capacitance value of the capacitive element C2 connected to the input node 41b of the sense amplifier 41 to Cref/2 by selectively turning on the switch SW4-1 of the plurality of switches SW4-1 to SW4-n.

The sense amplifier block 4p can set the combined capacitance value of the capacitive element C1 connected to the input node 41a of the sense amplifier 41 to 3Cref/4 by selectively turning on the switches SW3-1 and SW3-2 of the plurality of switches SW3-1 to SW3-n, and can set the combined capacitance value of the capacitive element C2 connected to the input node 41b of the sense amplifier 41 to 3Cref/4 by selectively turning on the switches SW4-1 and SW4-2 of the plurality of switches SW4-1 to SW4-n.

As a result, the switching operation of the amplitudes of the data lines DL[0] and DL[1] as illustrated in FIGS. 13 to 18 can be realized by varying the combined capacitance value of the capacitive elements C1 and C2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a first bit line connected to a first memory cell;
    a first data line connectable to and disconnectable from the first bit line;
    a second bit line connected to a second memory cell;
    a second data line connectable to and disconnectable from the second bit line;
    a sense amplifier having a first input node connected to the first data line and a second input node connected to the second data line;
    a switch capable of connecting the first data line and the second data line;
    a voltage generation circuit capable of supplying a reference voltage to at least one of the first data line and the second data line;
    a first capacitive element having one end connected to the first data line;
    a second capacitive element having one end connected to the second data line;
    a first pulse generation circuit that generates a first pulse having first polarity; and
    a second pulse generation circuit that generates a second pulse having second polarity, wherein
    in a first period, the semiconductor storage device maintains the switch in an ON state, and in a second period, the semiconductor storage device performs a first operation, a second operation and a third operation while maintaining the switch in an OFF state, the second period being a period after the first period, the first operation being an operation to supply the first pulse having the first polarity from the first pulse generation circuit to the other end of the first capacitive element, the second operation being an operation to supply the second pulse having the second polarity from the second pulse generation circuit to the other end of the second capacitive element, the third operation being an operation to connect the first bit line to the first data line.

2. The semiconductor storage device according to claim 1, wherein
    in a third period, the semiconductor storage device maintains the switch in an ON state, and in a fourth period, the semiconductor storage device performs a fourth operation, a fifth operation and a sixth operation while maintaining the switch in an OFF state, the fourth period being a period after the third period, the fourth operation being an operation to supply the second pulse having the second polarity from the second pulse generation circuit to the other end of the first capacitive element, the fifth operation being an operation to supply the first pulse having the first polarity from the first pulse generation circuit to the other end of the second capacitive element, the sixth operation being an operation to connect the second bit line to the second data line.

3. The semiconductor storage device according to claim 1, further comprising:
a second switch capable of connecting the first data line or the second data line to the voltage generation circuit, wherein
in the first period, the semiconductor storage device maintains each of the switch and the second switch in an ON state and, in the second period, the semiconductor storage device performs the first operation, the second operation, and the third operation while maintaining each of the switch and the second switch in an OFF state.

4. The semiconductor storage device according to claim 2, further comprising:
a second switch capable of connecting the first data line or the second data line to the voltage generation circuit, wherein
in the third period, the semiconductor storage device maintains each of the switch and the second switch in an ON state and, in the fourth period, the semiconductor storage device performs the fourth operation, the fifth operation, and the sixth operation while maintaining the switch and the second switch in an OFF state.

5. The semiconductor storage device according to claim 3, further comprising:
a third switch capable of connecting the first data line and one end of the first capacitive element; and
a fourth switch capable of connecting the second data line and one end of the second capacitive element, wherein
in the first period, the semiconductor storage device maintains each of the switch, the second switch, the third switch, and the fourth switch in an ON state, and, in the second period, the semiconductor storage device performs the first operation, the second operation, and the third operation while maintaining each of the switch and the second switch in an OFF state and maintaining each of the third switch and the fourth switch in an ON state.

6. The semiconductor storage device according to claim 4, further comprising:
a third switch capable of connecting the first data line and one end of the first capacitive element; and
a fourth switch capable of connecting the second data line and one end of the second capacitive element, wherein
in the third period, the semiconductor storage device maintains each of the switch, the second switch, the third switch, and the fourth switch in an ON state, and, in the fourth period, the semiconductor storage device performs the fourth operation, the fifth operation, and the sixth operation while maintaining each of the switch and the second switch in an OFF state and maintaining each of the third switch and the fourth switch in an ON state.

7. The semiconductor storage device according to claim 5, further comprising:
a fifth switch capable of connecting the other end of the first capacitive element and the first pulse generation circuit;
a sixth switch capable of connecting the other end of the first capacitive element and the second pulse generation circuit;
a seventh switch capable of connecting the other end of the second capacitive element and the first pulse generation circuit; and
an eighth switch capable of connecting the other end of the second capacitive element and the second pulse generation circuit, wherein
in the first period, the semiconductor storage device maintains each of the switch, the second switch, the third switch, and the fourth switch in an ON state and maintains each of the fifth switch, the sixth switch, the seventh switch, and the eighth switch in an OFF state, and in the second period, the semiconductor storage device performs the first operation, the second operation, and the third operation while maintaining each of the switch, the second switch, the fifth switch, and the eighth switch in an OFF state and maintaining each of the third switch, the fourth switch, the sixth switch, and the seventh switch in an ON state.

8. The semiconductor storage device according to claim 6, further comprising:
a fourth switch capable of connecting the other end of the first capacitive element and the first pulse generation circuit;
a fifth switch capable of connecting the other end of the first capacitive element and the second pulse generation circuit;
a sixth switch capable of connecting the other end of the second capacitive element and the first pulse generation circuit; and
a seventh switch capable of connecting the other end of the second capacitive element and the second pulse generation circuit, wherein
in the third period, the semiconductor storage device maintains each of the switch, the second switch, the third switch, and the fourth switch in an ON state and maintains each of the fifth switch, the sixth switch, the seventh switch, and the eighth switch in an OFF state, and in the fourth period, the semiconductor storage device performs the fourth operation, the fifth operation, and the sixth operation while maintaining each of the switch, the second switch, the sixth switch, and the seventh switch in an OFF state and maintaining each of the third switch, the fourth switch, the fifth switch, and the eighth switch in an ON state.

9. The semiconductor storage device according to claim 1, wherein
the first pulse generation circuit is capable of changing a potential amplitude of the first pulse.

10. The semiconductor storage device according to claim 9, wherein
the second pulse generation circuit is capable of changing a potential amplitude of the second pulse.

11. The semiconductor storage device according to claim 9, wherein
the first pulse generation circuit has a plurality of potential amplitudes of the first pulse, and generates the first pulse with a potential amplitude selected from the plurality of potential amplitudes according to an operation of the sense amplifier.

12. The semiconductor storage device according to claim 10, wherein
the first pulse generation circuit has a plurality of potential amplitudes of the first pulse, and generates the first pulse with a potential amplitude selected from the plurality of potential amplitudes according to an operation of the sense amplifier, and
the second pulse generation circuit has a plurality of potential amplitudes of the second pulse, and generates the second pulse with a potential amplitude selected from the plurality of potential amplitudes according to an operation of the sense amplifier.

13. The semiconductor storage device according to claim 1, wherein
the first capacitive element is a variable capacitive element.

14. The semiconductor storage device according to claim 13, wherein
the second capacitive element is a variable capacitive element.

15. The semiconductor storage device according to claim 13, wherein
the first capacitive element includes a plurality of first capacitors each having one end connected to the first data line.

16. The semiconductor storage device according to claim 14, wherein
the first capacitive element includes a plurality of first capacitors each having one end connected to the first data line, and
the second capacitive element includes a plurality of second capacitors each having one end connected to the second data line.

17. The semiconductor storage device according to claim 15, further comprising:
a plurality of first switch elements corresponding to the plurality of first capacitors, each of the first switch elements being capable of connecting the first data line and one end of a corresponding first capacitor.

18. The semiconductor storage device according to claim 16, further comprising:
a plurality of first switch elements corresponding to the plurality of first capacitors, each of the first switch elements being capable of connecting the first data line and one end of a corresponding first capacitor; and
a plurality of second switch elements corresponding to the plurality of second capacitors, each of the second switch elements being capable of connecting the second data line and one end of a corresponding second capacitor.

19. The semiconductor storage device according to claim 1, wherein
the first polarity and the second polarity are opposite polarities.

20. The semiconductor storage device according to claim 19, wherein
the first pulse generation circuit generates the first pulse having a positive amplitude, and
the second pulse generation circuit generates the second pulse having a negative amplitude.

* * * * *